(12) United States Patent
Mizushima et al.

(10) Patent No.: US 7,842,564 B2
(45) Date of Patent: Nov. 30, 2010

(54) SEMICONDUCTOR MEMORY DEVICE MANUFACTURING METHOD AND SEMICONDUCTOR MEMORY DEVICE

(75) Inventors: Ichiro Mizushima, Yokohama (JP); Hirokazu Ishida, Yokohama (JP); Yoshio Ozawa, Yokohama (JP); Takashi Suzuki, Yokohama (JP); Fumiki Aiso, Yokohama (JP); Makoto Mizukami, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 105 days.

(21) Appl. No.: 12/167,695

(22) Filed: Jul. 3, 2008

(65) Prior Publication Data

US 2009/0014828 A1 Jan. 15, 2009

(30) Foreign Application Priority Data

Jul. 6, 2007 (JP) ............................. 2007-178988

(51) Int. Cl.
*H01L 21/84* (2006.01)
(52) U.S. Cl. ............... 438/166; 438/258; 257/E21.179; 257/21.561
(58) Field of Classification Search ......... 438/151–166, 438/257–267; 257/E21.179, E21.561
See application file for complete search history.

(56) References Cited

U.S. PATENT DOCUMENTS

| 4,592,799 | A | 6/1986 | Hayafuji |
| 4,874,718 | A | 10/1989 | Inoue |
| 2005/0236668 | A1 * | 10/2005 | Zhu et al. ............... 257/347 |
| 2007/0102749 | A1 | 5/2007 | Shirota et al. |
| 2007/0138576 | A1 | 6/2007 | Mizukami et al. |
| 2007/0158736 | A1 | 7/2007 | Arai et al. |
| 2007/0298594 | A1 | 12/2007 | Mizushima et al. |
| 2008/0073695 | A1 | 3/2008 | Mizukami et al. |

FOREIGN PATENT DOCUMENTS

| JP | 5-335234 | 12/1993 |
| JP | 6-333822 | 12/1994 |
| JP | 9-36042 | 2/1997 |

OTHER PUBLICATIONS

U.S. Appl. No. 11/963,046, filed Dec. 21, 2007, Fumitaka Arai, et al.
U.S. Appl. No. 12/040,224, filed Feb. 29, 2008, Unknown.
U.S. Appl. No. 12/022,382, filed Jan. 30, 2008, Takeshi Murata, et al.
U.S. Appl. No. 12/145,109, filed Jun. 24, 2008, Unknown.
U.S. Appl. No. 12/146,143, filed Jun. 25, 2008, Unknown.
U.S. Appl. No. 12/146,802, filed Jun. 26, 2008, Suzuki, et al.

* cited by examiner

*Primary Examiner*—Richard A. Booth
(74) *Attorney, Agent, or Firm*—Oblon, Spivak, McClelland, Maier & Neustadt, L.L.P.

(57) ABSTRACT

In a method of manufacturing a semiconductor memory device, an opening is made in a part of an insulating film formed on a silicon substrate. An amorphous silicon thin film is formed on the insulating film in which the opening has been made and inside the opening. Then, a monocrystal is solid-phase-grown in the amorphous silicon thin film, with the opening as a seed, thereby forming a monocrystalline silicon layer. Then, the monocrystalline silicon layer is heat-treated in an oxidizing atmosphere, thereby thinning the monocrystalline silicon layer and reducing the defect density. Then, a memory cell array is formed on the monocrystalline silicon layer which has been thinned and whose defect density has been reduced.

14 Claims, 26 Drawing Sheets

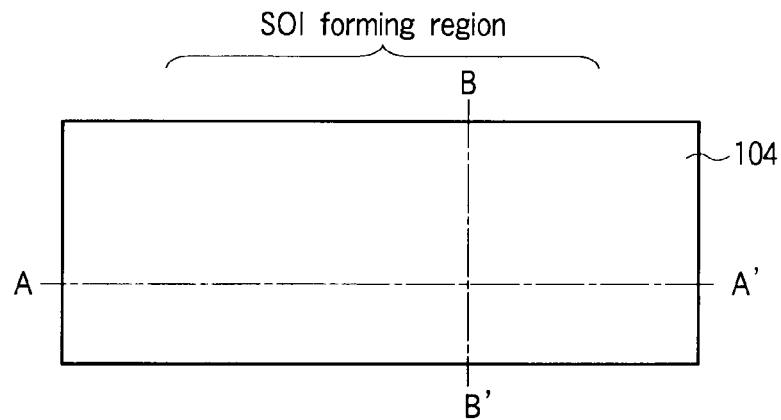
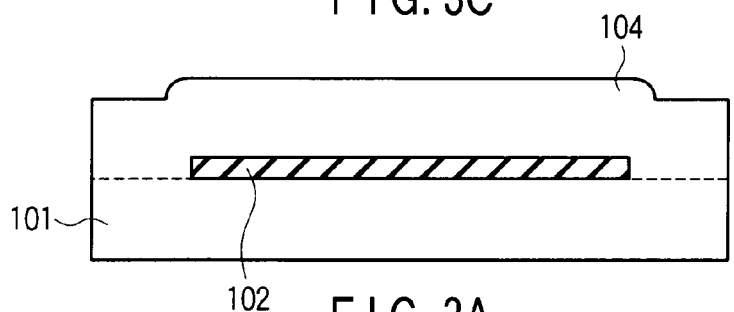
FIG. 3A
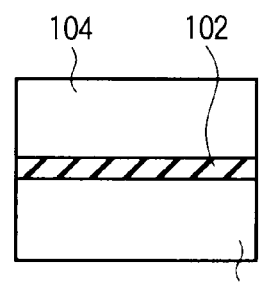
FIG. 3B
FIG. 3C
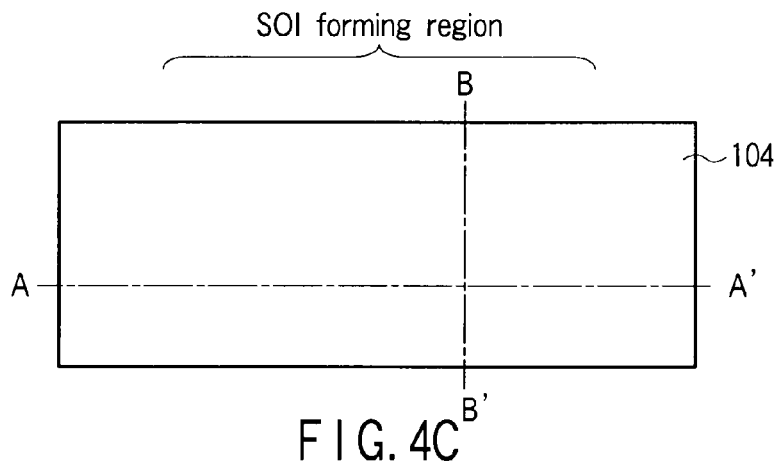
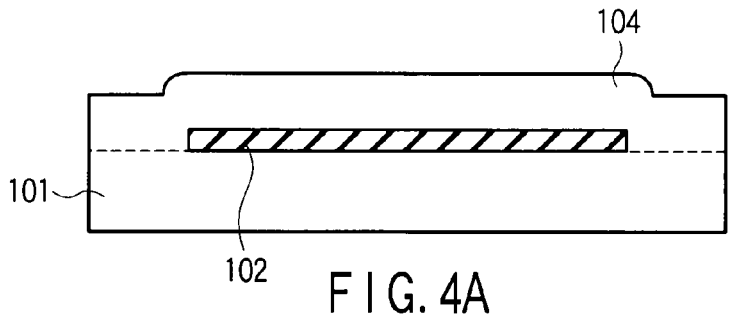
FIG. 4A
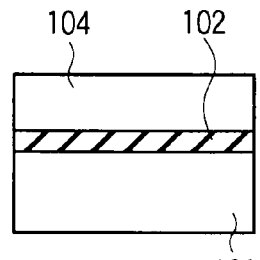
FIG. 4B
FIG. 4C

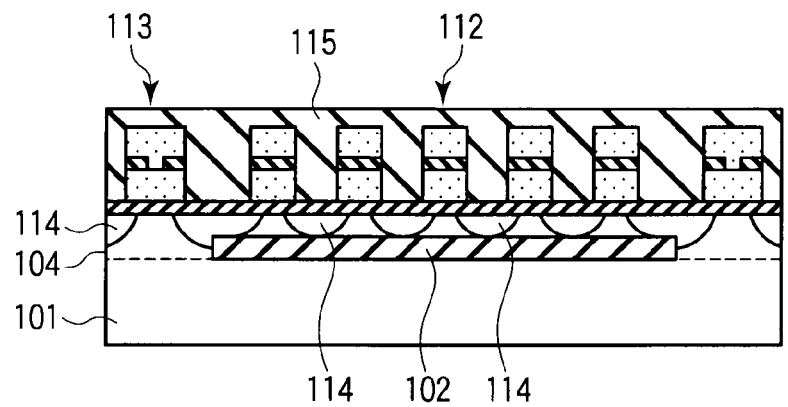 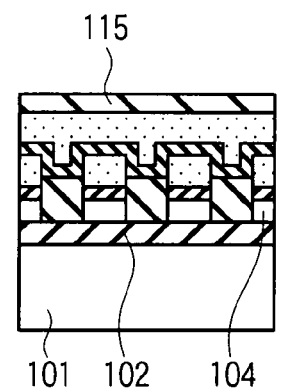
FIG. 11A  FIG. 11B
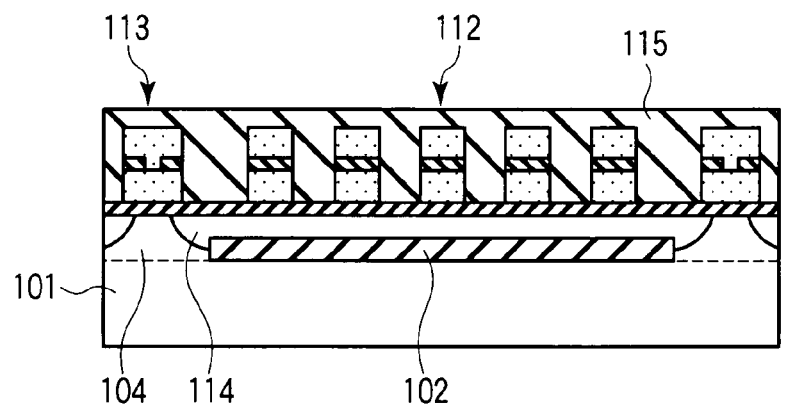 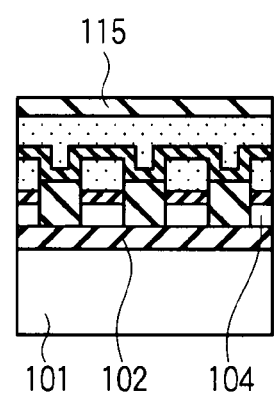
FIG. 12A  FIG. 12B

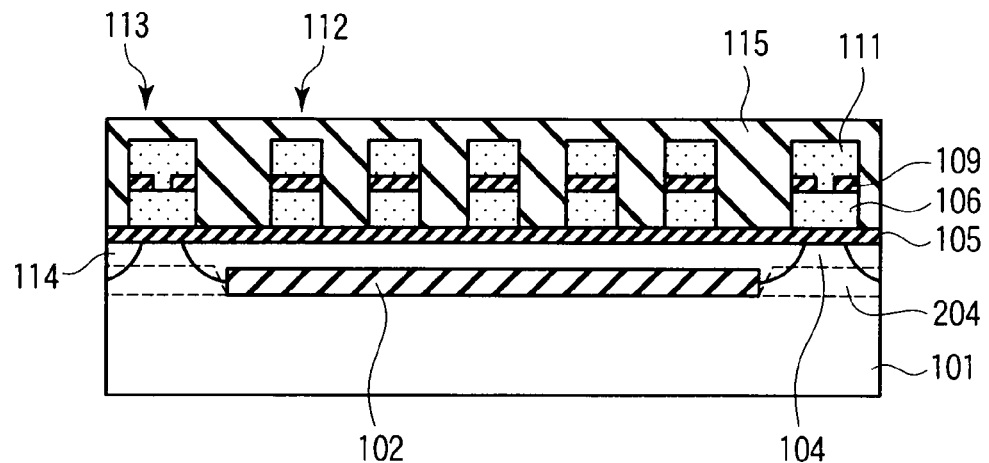
F I G. 17
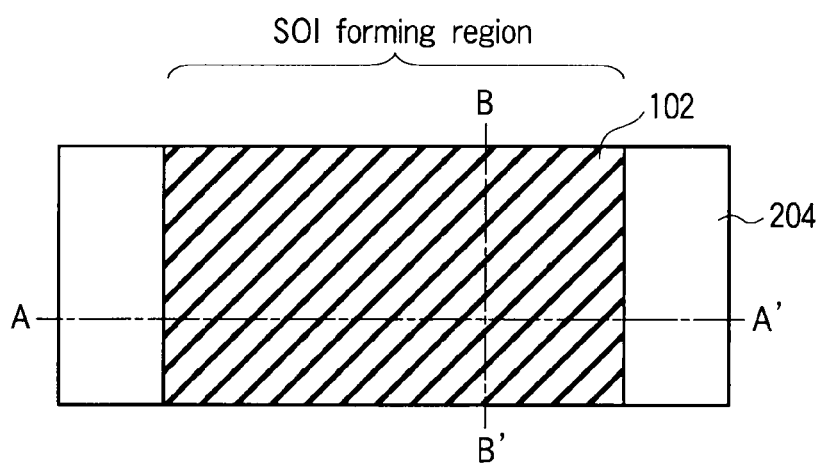
F I G. 18C
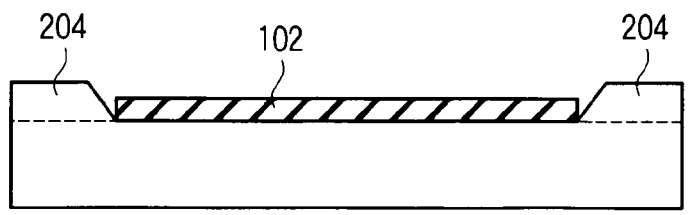
F I G. 18A
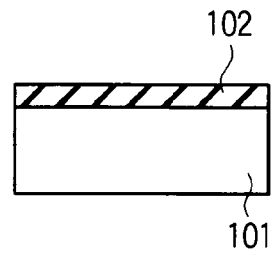
F I G. 18B

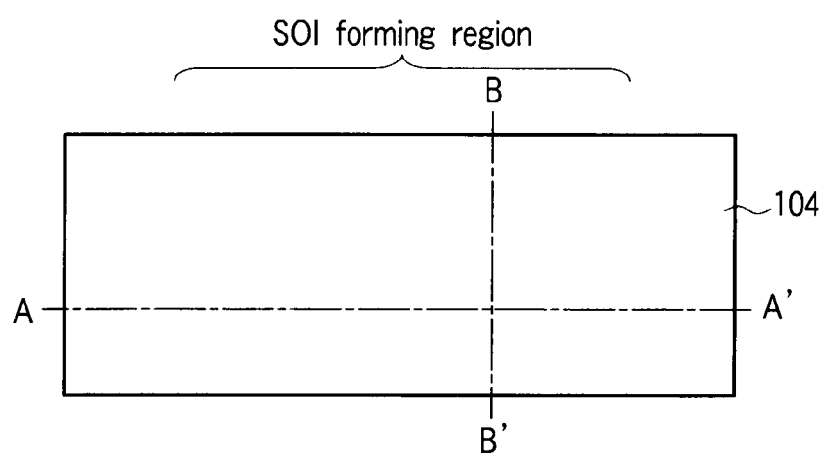
F I G. 23C
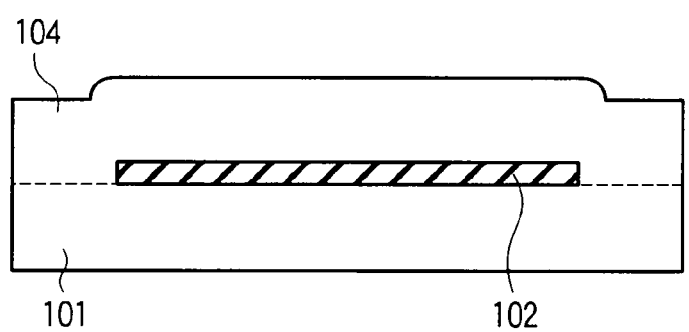
F I G. 23A
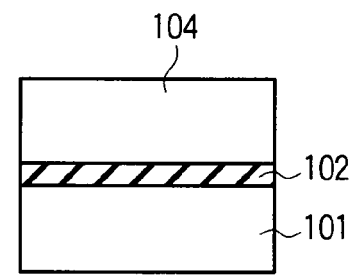
F I G. 23B

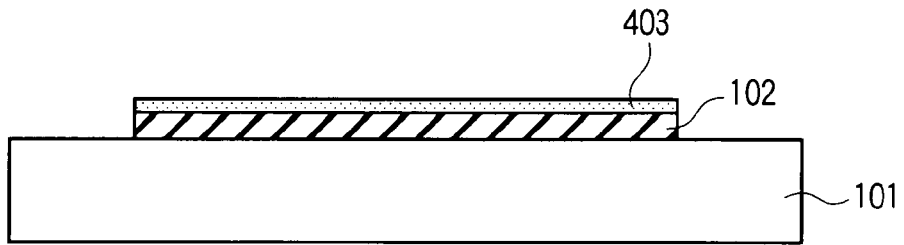
F I G. 29A
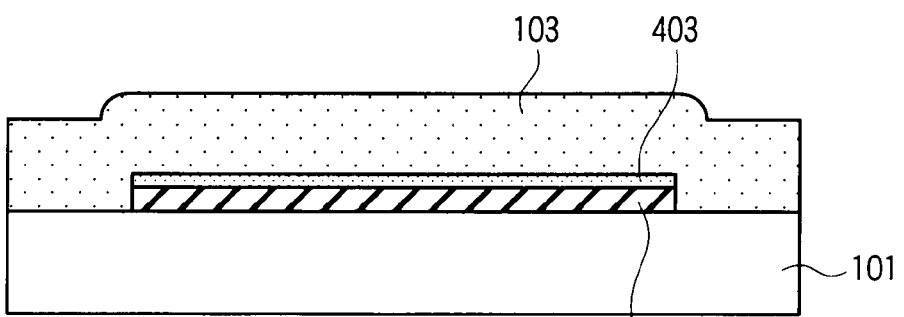
F I G. 29B
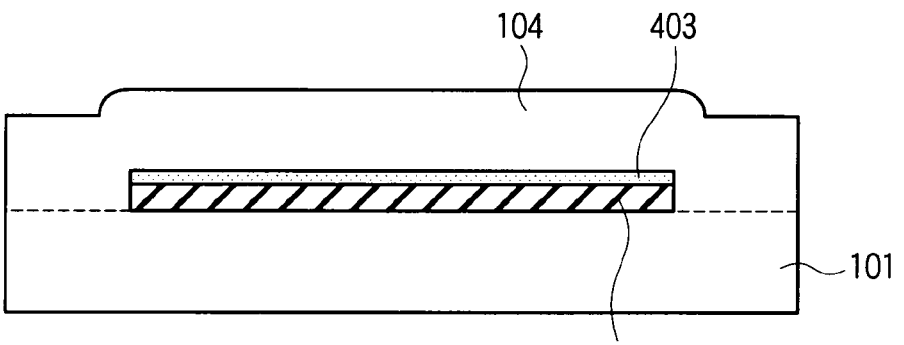
F I G. 29C
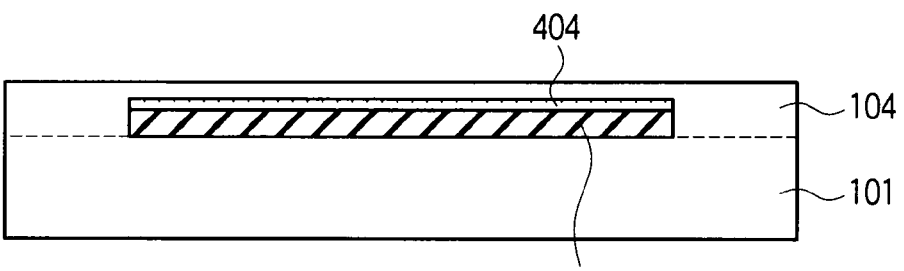
F I G. 29D

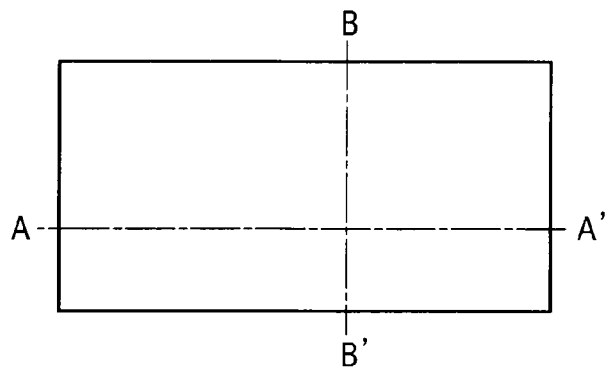
F I G. 34C
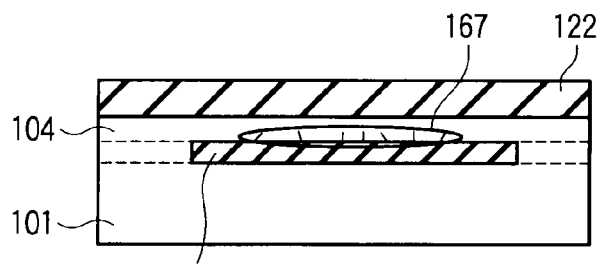
F I G. 34A
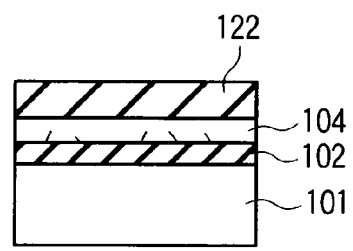
F I G. 34B
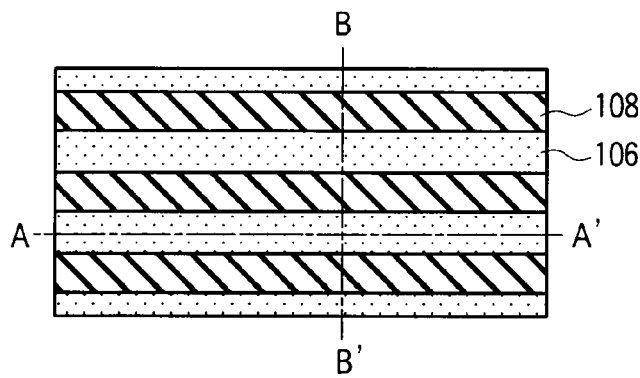
F I G. 35C
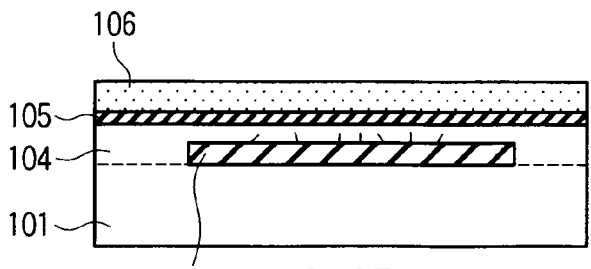
F I G. 35A
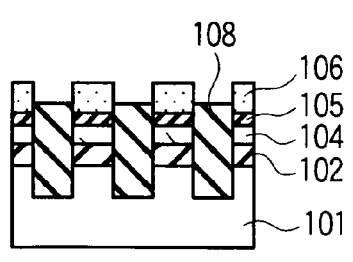
F I G. 35B

SEMICONDUCTOR MEMORY DEVICE MANUFACTURING METHOD AND SEMICONDUCTOR MEMORY DEVICE

CROSS-REFERENCE TO RELATED APPLICATIONS

This application is based upon and claims the benefit of priority from prior Japanese Patent Application No. 2007-178988, filed Jul. 6, 2007, the entire contents of which are incorporated herein by reference.

BACKGROUND OF THE INVENTION

1. Field of the Invention

This invention relates to a method of manufacturing a semiconductor memory device with silicon-on-insulator (SOI) structure memory cells and to a semiconductor memory device.

2. Description of the Related Art

The structure of a memory cell in a conventional nonvolatile semiconductor memory device has its limits even if an attempt is made to miniaturize the memory cell in dimensions. In a typical case, if the channel length of a memory cell is set to 50 nm or less, the on-off ratio of the channel current decreases due to a short channel effect, with the result that the transistor of the memory cell malfunctions. This causes a problem: semiconductor memory devices cannot be highly integrated.

To overcome this problem, a method of forming memory cells on an SOI crystal has been proposed in recent years (e.g., Jpn. Pat. Appln. KOKAI Publication No. 5-335234, Jpn. Pat. Appln. KOKAI Publication No. 6-333822, or Jpn. Pat. Appln. KOKAI Publication No. 9-036042). However, it is difficult to form on an insulating film a large-area silicon layer with good crystallinity. This contributes to variations in the characteristics from one cell to another. Particularly in an SOI-structure element formed by solid-phase-epitaxial growth, the surface of non-conformity whose position is uncertain develops on a buried insulating film. This causes a problem: a cell transistor is formed on the non-conforming surface, making the operation unstable.

BRIEF SUMMARY OF THE INVENTION

According to an aspect of the invention, there is provided a method of manufacturing a semiconductor memory device, comprising: making an opening in a part of an insulating film formed on a silicon substrate which has {100} plane orientation as a main surface; forming an amorphous silicon thin film on the insulating film in which the opening has been made and inside the opening; forming a monocrystalline silicon layer by changing the amorphous silicon thin film in to a monocrystal in the <100> direction by solid-phase-growth, with the opening as a seed; thinning the crystal layer by heat-treating the monocrystalline silicon layer in an oxidizing atmosphere; and forming a memory cell array on the monocrystalline silicon layer subjected to the thinning process.

According to another aspect of the invention, there is provided a method of manufacturing a semiconductor memory device, comprising: making an opening in a part of an insulating film formed on a silicon substrate; forming a first amorphous silicon film inside the opening so as to be buried in the opening; forming a second amorphous silicon film on the insulating film and the first amorphous silicon film; forming a monocrystal layer by solid-phase-epitaxial-growth the first and second amorphous silicon films, with the opening as a seed; forming an oxide film at the surface of the crystal layer by heat-treating the monocrystal layer in an oxidizing atmosphere; removing the oxide film; and forming a memory cell array in the surface region of the monocrystal layer.

According to still another aspect of the invention, there is provided a semiconductor memory device comprising: an insulating film which is formed on a silicon substrate and in a part of which an opening is made; a silicon oxide film which is formed at the surface of the silicon substrate exposed inside the opening in the insulating film and whose thickness is less than a thickness required to function as an insulating film; a monocrystalline silicon layer which is solid-phase-grown on the insulating film and inside the opening, with the opening as a seed; and a memory cell array formed on the monocrystalline silicon layer.

BRIEF DESCRIPTION OF THE SEVERAL VIEWS OF THE DRAWING

FIGS. 3A to 3C are sectional views and a plan view, respectively, to help explain nonvolatile semiconductor memory device manufacturing processes according to the first embodiment;

FIGS. 4A to 4C are sectional views and a plan view, respectively, to help explain nonvolatile semiconductor memory device manufacturing processes according to the first embodiment;

FIGS. 11A and 11B are sectional views to help explain nonvolatile semiconductor memory device manufacturing processes according to the first embodiment;

FIGS. 12A and 12B are sectional views showing the configuration of a nonvolatile semiconductor memory device according to a modification of the first embodiment;

FIG. 17 is a sectional view showing the configuration of a nonvolatile semiconductor memory device according to a modification of the second embodiment;

FIGS. 18A to 18C are sectional views and a plan view, respectively, to help explain nonvolatile semiconductor memory device manufacturing processes according to a third embodiment of the invention;

FIGS. 23A to 23C are sectional views and a plan view, respectively, to help explain nonvolatile semiconductor memory device manufacturing processes according to the fifth embodiment;

FIGS. 29A to 29H are sectional views to help explain nonvolatile semiconductor memory device manufacturing processes according to an eighth embodiment of the invention;

FIGS. 34A to 34C are sectional views and a plan view, respectively, to help explain nonvolatile semiconductor memory device manufacturing processes according to the ninth embodiment;

FIGS. 35A to 35C are sectional views and a plan view, respectively, to help explain nonvolatile semiconductor memory device manufacturing processes according to the ninth embodiment;

DETAILED DESCRIPTION OF THE INVENTION

Hereinafter, referring to the accompanying drawings, embodiments of the invention will be explained in detail.

First Embodiment

To solve the aforementioned problems, a first embodiment of the invention provides a method of manufacturing a nonvolatile semiconductor memory device which has an SOI-structure memory cell part. The first embodiment particularly provides a method of realizing ultrathin-film SOI-structure memory cells with excellent crystallinity so as not only to suppress cell-to-cell variations and realize a high cell current but also suppress a short-channel effect.

A method of manufacturing a memory cell part according to the first embodiment will be explained using FIGS. 1A to 1C to FIGS. 15A to 15E. In FIGS. 1A to 1C to FIGS. 13A to 13C, A indicates a sectional view in the direction of channel length (or the bit line direction), B indicates a sectional view in the direction of channel width (or the word line direction), and C indicates a plan view. In addition, A shows a sectional view taken along line A-A' of the plan view C and B shows a sectional view taken along line B-B' of the plan view C.

Figure 1C:
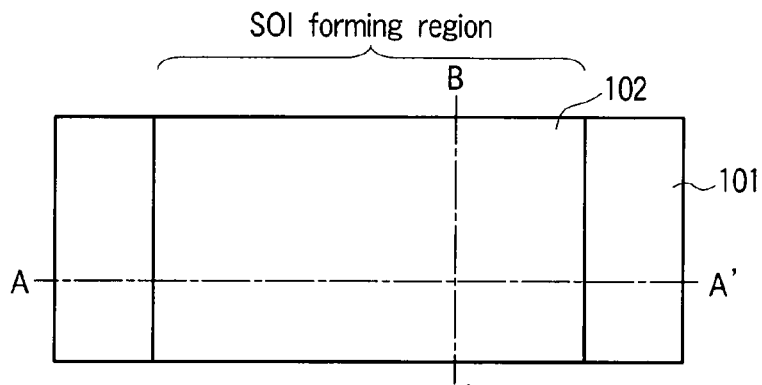
FIGS. 1A to 1C are sectional views and a plan view, respectively, to help explain nonvolatile semiconductor memory device manufacturing processes according to a first embodiment of the invention.
Figure 1A:
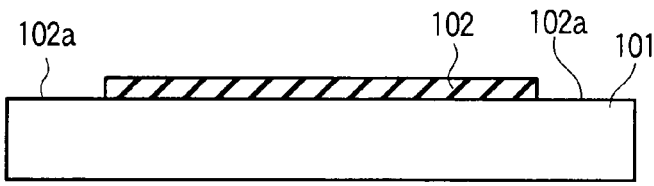
Figure 1B:
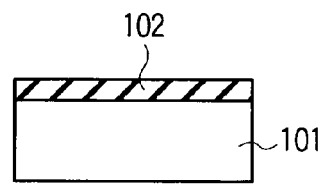

First, as shown in FIGS. 1A to 1C, a 50-nm-thick silicon oxide film 102 was formed on a p-type monocrystalline silicon substrate 101 of (001) plane orientation. Then, with a patterned resist (not shown) as a mask, a partial region of the silicon oxide film 102 was removed to make an opening 102a so as to expose a part of the silicon substrate 101 in the opening 102a.

Here, the pattern openings in the resist mask were made parallel to either the [100] direction or the [010] direction. The openings 102a were made so as to sandwich an SOI formation region between them on both sides of the region or enclose the SOI formation region.

Figure 2C:
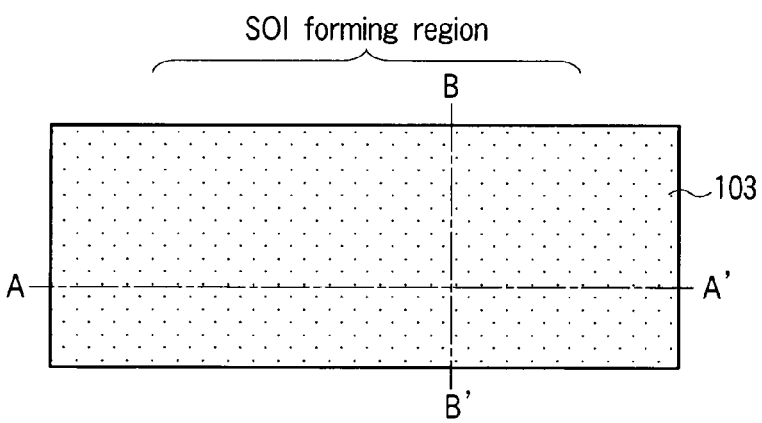
FIGS. 2A to 2C are sectional views and a plan view, respectively, to help explain nonvolatile semiconductor memory device manufacturing processes according to the first embodiment.
Figure 2A:
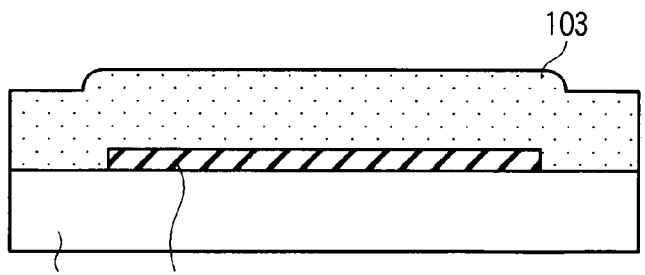
Figure 2B:
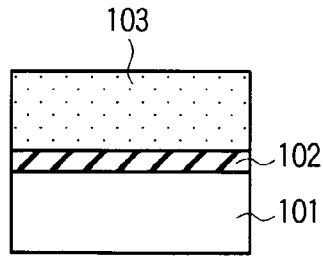

Next, as shown in FIGS. 2A to 2C, on the entire surface of the substrate 101, an amorphous silicon film 103 was deposited to a thickness of 200 nm. The amorphous silicon film 103 was deposited at a temperature of 550° C. using an LPCVD unit. To suppress the formation of a chemical oxide film at the interface between the amorphous silicon film 103 and substrate 101, heat-treating was performed at 900° C. in a hydrogen atmosphere for one minute in the LPCVD unit before the deposition of the amorphous silicon film 103.

Even when the process of suppressing the formation of a chemical oxide film has been carried out, oxygen whose surface density is about $10^{13}$ cm$^{-2}$ may be detected at the interface. Oxygen whose surface density is equal to or less than the above level does not constitute a limiting factor of solid-phase-epitaxial growth.

An Si film directly above the opening (seed) 102a in the silicon oxide film 102 starts to crystallize in a region in contact with a part of the substrate at the time of film formation. As a result, when the film thickness of the amorphous silicon film 103 is set to 200 nm, the Si film may grow only to about 50% of the thickness of the amorphous film. The reason is that, when the density of dangling bonds exposed at the crystallized surface is lower than that at the amorphous surface and therefore the crystallized surface has a lower sticking coefficient of atoms. Accordingly, the film formation speed at the crystallized surface is slower than that at the amorphous surface.

Next, the wafer was heat-treated at 650° C. for 30 minutes in a nitrogen atmosphere, thereby performing solid-phase-epitaxial growth using as a seed the part in contact with the amorphous silicon film 103 of the silicon substrate 101. As a result, the amorphous silicon film 103 was monocrystallized, thereby producing a monocrystalline silicon layer (SOI crystal layer) 104 as shown in FIGS. 3A to 3C. At this time, the rate at which the monocrystallization proceeded laterally from the seed was 2.1 μm/hour. After the solid-phase-epitaxial growth, when the crystallized state of the SOI crystal layer 104 was observed, it was recognized that distribution existed at high density.

Next, as shown in FIGS. 4A to 4C, the surface of the wafer was polished by CMP techniques, thereby smoothing the surface. Consequently, the film thickness of the SOI crystal layer 104 was 120 nm above the SOI region and 100 nm directly above the seed, with the result that the 50-nm-thick steps directly above the seed and above the SOI region decreased to 20 nm in thickness. Although the layer was thinned by CMP, known RIE techniques may be used. Alternatively, the layer may not be thinned.

Figure 5C:
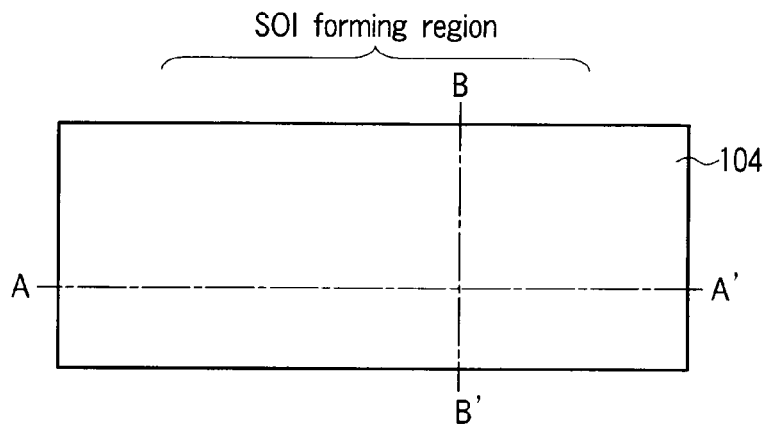
FIGS. 5A to 5C are sectional views and a plan view, respectively, to help explain nonvolatile semiconductor memory device manufacturing processes according to the first embodiment.
Figure 5A:
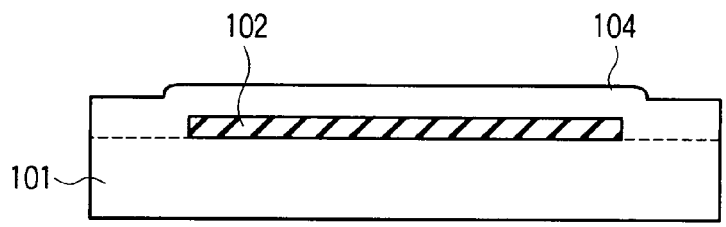
Figure 5B:
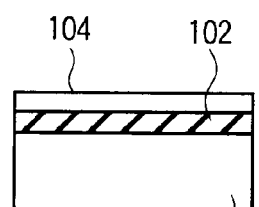

Next, the wafer was heat-treated for 120 minutes in an oxidizing atmosphere of 1050° C. By the process, the SOI crystal layer 104 was oxidized 60 nm from the surface. The thickness of the remaining crystalline SOI layer was 60 nm. On the SOI layer, a memory cell array was formed, producing a film thickness suitable for operations. Thereafter, the formed oxide film layer was etched by hydrofluoric acid diluted with water. FIGS. 5A to 5C show the structure at that time. When the crystallized state of the SOI crystal layer 104 was observed after the heat treatment in the oxidizing atmosphere, it was recognized that distribution which had been observed at high density before the heat treatment decreased significantly.

The reason why distribution decreased as a result of heat treatment is as follows. The film deposited in an amorphous state has a lower density than a single crystal. Therefore, in a state where amorphous silicon has been turned into a monocrystal by solid-phase-epitaxial growth, distribution resulting from the existence of high-density holes are liable to take place. The distribution decrease when the density of holes is decreased. To achieve this, there is a method of supplying interstitial silicon from the surface by thermal oxidation.

An improvement in the crystallinity by the supply of interstitial silicon is particularly effective for an SOI turned into a monocrystal by lateral solid-phase-epitaxial growth as described in the first embodiment. The reason is that the oxide film layer (buried oxide [BOX]) at the bottom of the SOI prevents the interstitial silicon supplied from the surface from diffusing, which increases a proportion of the interstitial silicon used to remedy distribution in the thin SOI layer.

Specifically, the oxidation treatment of the first embodiment involves not only thinning the silicon layer to a thickness suitable for the formation of memory cells on the SOI crystal layer but also decreasing the crystal defect density. That is, the oxidation treatment is a very effective process because it is capable of performing necessary processes to form memory cells.

Figure 6C:
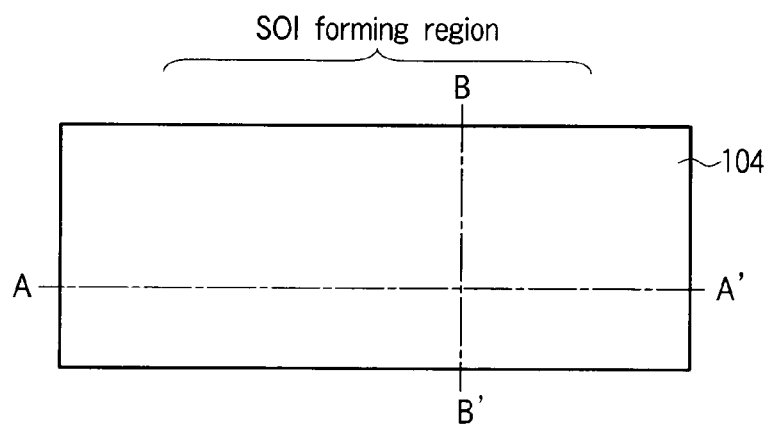
FIGS. 6A to 6C are sectional views and a plan view, respectively, to help explain nonvolatile semiconductor memory device manufacturing processes according to the first embodiment.
Figure 6A:
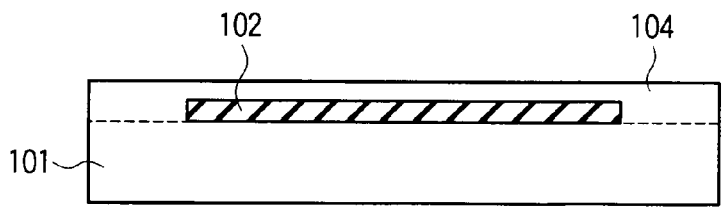
Figure 6B:
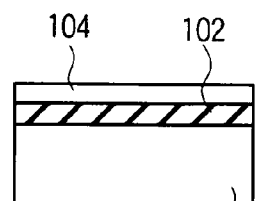

Next, the wafer was polished again by CMP techniques, with the result that the steps observed at the surface of the SOI crystal layer 104 before the heat treatment were decreased in level as shown in FIGS. 6A to 6C. It was seen that a 20-nm-high step before the heat treatment was thinned to a step having a height of 5 nm or less by the CMP process.

Figure 7C:
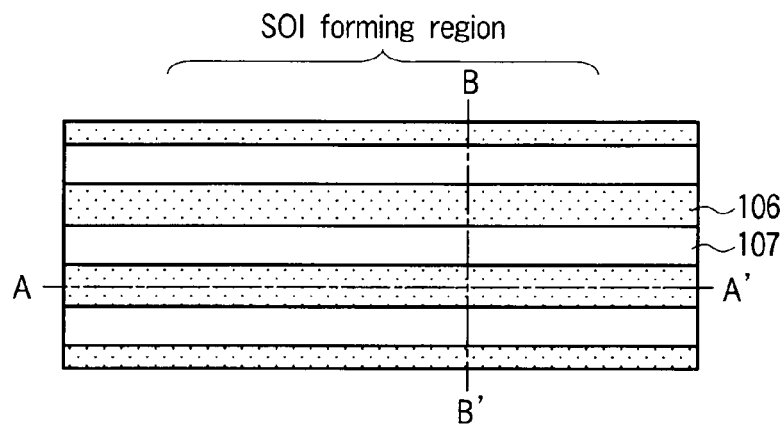
FIGS. 7A to 7C are sectional views and a plan view, respectively, to help explain nonvolatile semiconductor memory device manufacturing processes according to the first embodiment.
Figure 7A:
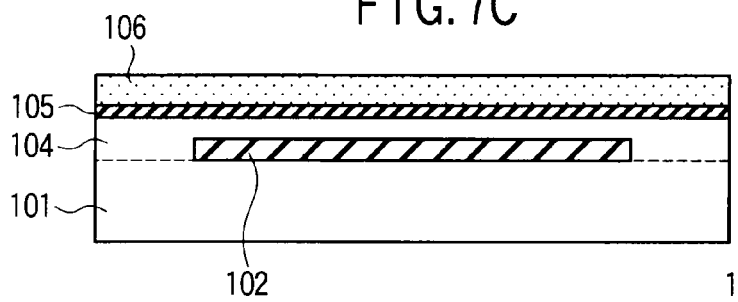
Figure 7B:
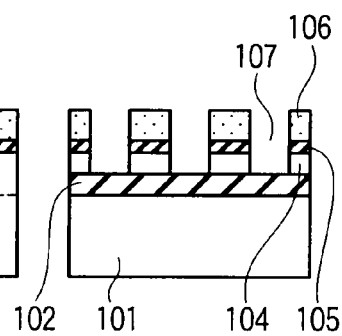

Next, as shown in FIGS. 7A to 7C, a gate insulating film (or a tunnel insulating film) 105 about 7 nm thick was formed on the entire surface by thermal oxidation techniques or the like. Moreover, a phosphorus-doped polysilicon layer 106 about 50 nm thick serving as a floating gate electrode was deposited by chemical vapor deposition (CVD) techniques or the like. Then, with a striped pattern resist (not shown) as a mask, the polysilicon layer 106, gate insulating film (tunnel insulating film) 105, and a part of the SOI crystal layer 104 were removed by RIE techniques or the like, thereby forming an element isolation trench 107.

Figure 8C:
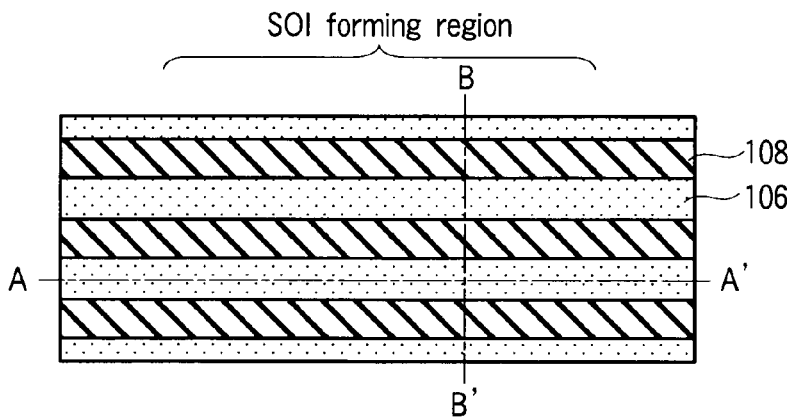
FIGS. 8A to 8C are sectional views and a plan view, respectively, to help explain nonvolatile semiconductor memory device manufacturing processes according to the first embodiment.
Figure 8A:
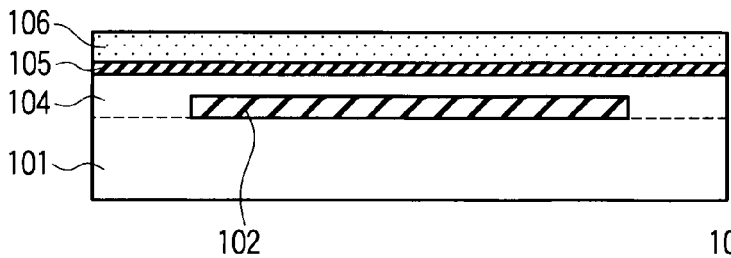
Figure 8B:
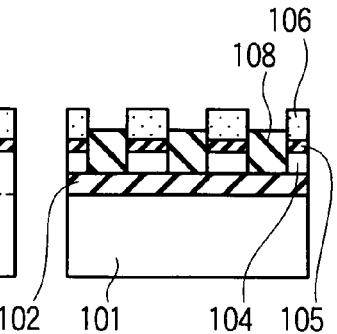

Next, as shown in FIGS. 8A to 8C, a buried insulating film 108 was embedded in the element isolation trench 107 by coating techniques or the like. For example, applying a coating insulating film made of polysilazane or the like enables the formation of an incompletely buried region termed a void to be avoided. The lower the permittivity of the buried insulating film 108, the more the withstand voltage between adjacent memory cells increases. For this reason, it is desirable that steam oxidation should be performed after the coating to eliminate impurities, including nitrogen, carbon, and hydrogen, in the film and turn the insulating film into a silicon oxide film. Furthermore, to remedy crystal defects developed in the surface of the trench at the time of formation of the element isolation trench, thermal oxidation or radical oxidation may be performed before or after the coating insulating film 108 is embedded. Moreover, to improve the insulating properties of the buried insulating film 108, a combination of a CVD insulating film and a coating insulating film may be buried.

As described above, in a state where the SOI region had been processed into a stripe pattern, the crystallized state of the SOI crystal layer 104 after the process expected to involve crystal defects, such as oxidation, was observed by planar TEM. It was recognized that the defect density of the region processed into a stripe pattern decreased dramatically as compared with that of a region not processed into a stripe pattern. The reason is that, when the region has been processed into a stripe pattern, distribution are released not only at the SOI surface but also its side surface. Consequently, it is conceivable that the defect density of the region processed into a stripe pattern had decreased as compared with a region not processed into a stripe pattern.

Accordingly, the narrower the width of the stripe (the width of the SOI region), the higher the crystallinity. Then, when the width of the stripe was 100 nm or less, preferably 50 nm or less, the difference between the striped region and the unstriped region was noticeable. For this reason, it is desirable that the SOI region of the first embodiment should be processed so as to have the same stripe width as the above-described one.

The SOI crystal layer 104 may be heat-treated or oxidized after it is processed into a stripe pattern. The reason is that not only is the dislocation released at the side surface, but also oxygen effective in decreasing the distribution density is also supplied to the side surface. Moreover, heat treatment may be performed before the SOI crystal is processed into a stripe pattern (FIGS. 4A to 4C) and after the stripe formation, that is, heat treatment may be performed twice.

Figure 9C:
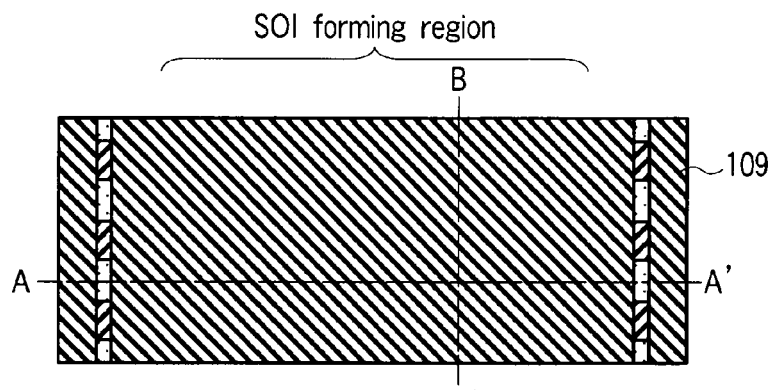
FIGS. 9A to 9C are sectional views and a plan view, respectively, to help explain nonvolatile semiconductor memory device manufacturing processes according to the first embodiment.
Figure 9A:
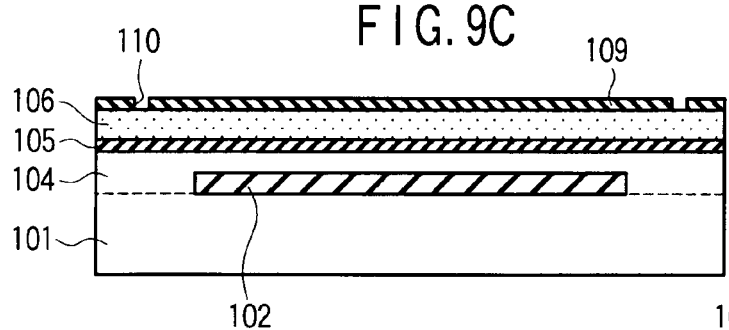
Figure 9B:
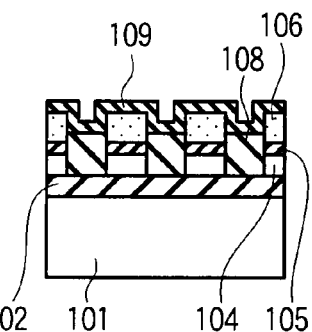

Next, as shown in FIGS. 9A to 9C, an alumina film 109 about 15 nm thick serving as an interelectrode insulating film was formed on the entire surface by atomic layer deposition (ALD) techniques or the like. The interelectrode insulating film is not limited to alumina and may be a stacked structure of an oxide film/a nitride film/an oxide film. Then, with a patterned resist (not shown) as a mask, a slit part 110 about 50 nm wide was formed in a select gate transistor formation region by RIE techniques or the like, thereby exposing a part of the polysilicon layer 106.

Figure 10C:
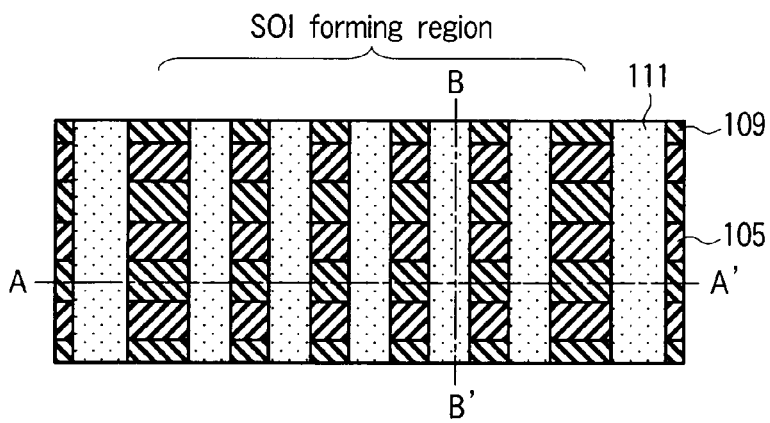
FIGS. 10A to 10C are sectional views and a plan view, respectively, to help explain nonvolatile semiconductor memory device manufacturing processes according to the first embodiment.
Figure 10A:
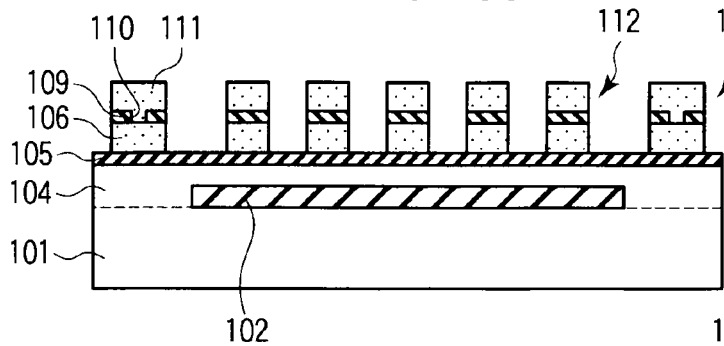
Figure 10B:
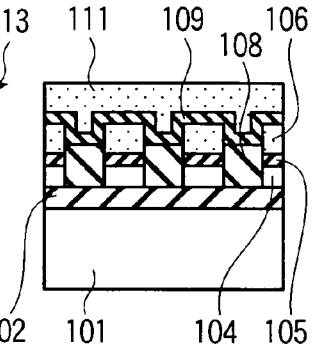

Next, as shown in FIGS. 10A to 10C, a tungsten silicide layer 111 serving as a control gate electrode was formed on the entire surface by sputtering techniques or the like. At this time, at the slit part 110, the polysilicon layer 106 and the tungsten silicide layer 111 were connected electrically. Thereafter, with the striped pattern resist as a mask (not shown), the tungsten silicide layer 111, alumina film 109, and a part of the polysilicon layer 106 were removed by RIE techniques or the like, thereby forming a two-layer gate structure 112 of a memory cell and a stacked gate electrode structure 113 of a select gate transistor.

Next, as shown in FIGS. 11A and 11B, an n-type impurity diffused layer 114 having a desired impurity concentration distribution was formed by a combination of ion implantation techniques and thermal diffusion techniques or the like. Then, an interlayer insulating film 115 was formed by CVD techniques or the like, thereby covering the two-layer structures of the memory cells and the stacked gate electrode structures 113 of the select gate transistors with the interlayer insulating film 115. Moreover, openings were made in the top of the impurity diffused layers of the select gate transistors by a known method and a conductive material, such as tungsten, was embedded in the openings, thereby forming bit line contacts 116 (and source line contacts, not shown). Thereafter, a nonvolatile semiconductor memory device was completed by a known method.

While in FIGS. 11A and 11B, the n-type impurity diffused layers 114 of the memory cell are isolated from one another, the invention is not necessarily limited to such a structure. For example, as shown in FIGS. 12A and 12B, the n-type impurity memory layers 114 of the individual memory cells may be connected to one another. When the n-type impurity memory layers 114 are connected to one another, a voltage is applied to the gate electrode and the current path of the SOI crystal layer directly beneath the corresponding gate electrode in the SOI crystal layer 104 is shut off, thereby determining whether or not charges have been stored in the cell. The reason why such an operation is possible is that the SOI structure is used. Such an operation can be performed only when a sufficiently thin SOI crystal layer is applied to a memory cell as described in the first embodiment.

As described above, the SOI crystal layer 104 of a memory cell formed in the first embodiment is a monocrystal formed by lateral solid-phase-epitaxial growth. That is, a large-area silicon layer with good crystallinity can be formed on an insulating film. Accordingly, a memory cell array can be formed on the large-area silicon layer 104 with good crystallinity. Consequently, variations in the characteristics from one memory cell to another can be suppressed. Moreover, the short channel effect characteristic of the SOI structure can be suppressed, which enables the off current to be reduced sufficiently. As a result, an erroneous operation of the nonvolatile semiconductor memory device can be avoided.

Furthermore, in the first embodiment, the select gate transistors are formed in a non-SOI region outside the SOI formation region. In the non-SOI region, since a silicon layer has been grown epitaxially on the silicon crystal substrate, the crystallinity is better. Accordingly, the junction leakage of the select gate transistor can be decreased sufficiently, making it possible to avoid an erroneous operation of the nonvolatile semiconductor memory device in, for example, reading data.

Figure 13C:
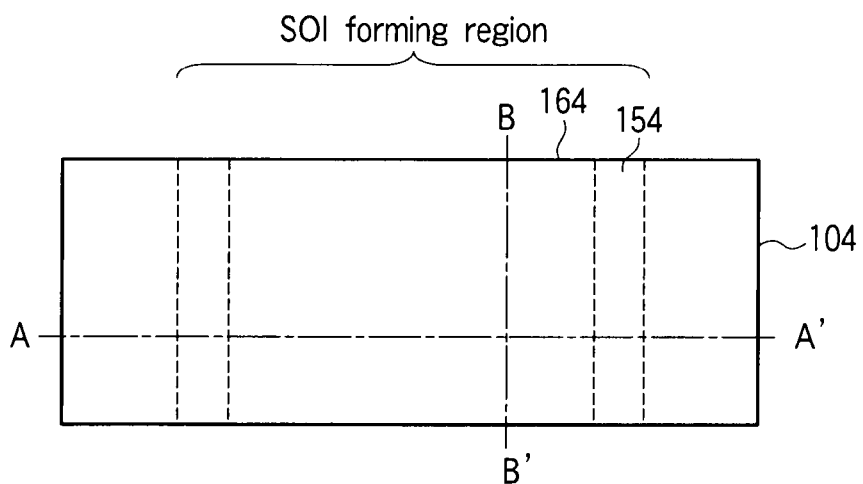
FIGS. 13A to 13C are sectional views and a plan view, respectively, to help explain the first embodiment, particularly showing the crystallization when the direction of the pattern is caused to differ from that of FIG. 3.
Figure 13A:
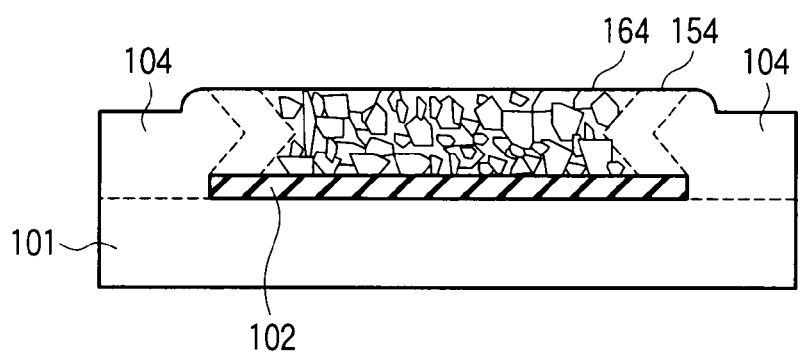
Figure 13B:
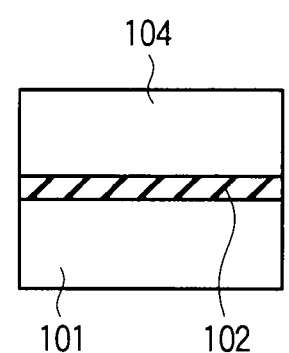

In the first embodiment, the direction of the pattern was made parallel with either the [100] direction or the [010] direction using a substrate of (001) plane orientation. However, when the direction of the pattern was made parallel with either the [110] direction or the [0-10] direction as in an ordinary (001) substrate, monocystallization as in the first embodiment was not observed. Specifically, as shown in FIGS. 13A to 13C corresponding to FIGS. 3A to 3C, showing intermediate processes, the insulating film 102 was not monocrystallized, with the result that a region close to the seed became a region 154 including twin crystal at high density and a region far away from the seed became a polycrystal region 164.

To get at the reason why crystallization differed according to the direction in which lateral solid-phase-epitaxial growth proceeded, heat treatment for solid-state growth was performed at 600° C. for 30 minutes, an hour, an hour and a half, two hours, and four hours, and the crystallized states for the respective durations were observed. FIGS. 14A to 14E show a case where solid-phase-epitaxial growth was caused to proceed in the <100> direction. FIGS. 15A to 15E show a case where solid-phase-epitaxial growth was caused to proceed in the <110> direction. When solid-phase-epitaxial growth was caused to proceed in the <100> direction, it is seen that the solid-phase-epitaxial growth distance increased in proportion to the heat treatment time as shown in FIGS. 14A to 14E. In contrast, when solid-phase-epitaxial growth was caused to proceed in the <110> direction, it is seen that the solid-phase-epitaxial growth distance increased slowly and therefore the layer was not monocrystallized all the way to a region far away from the seed as shown in FIGS. 15A to 15E, with the result that the layer was polycrystallized as a result of heterogeneous nucleation.

Figure 15A:
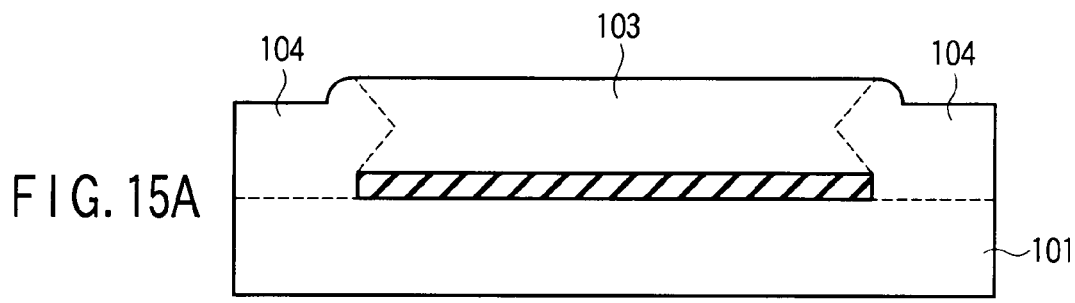
FIGS. 15A to 15E are sectional views to help explain solid-phase-epitaxial growth in the <110> direction.
Figure 15B:
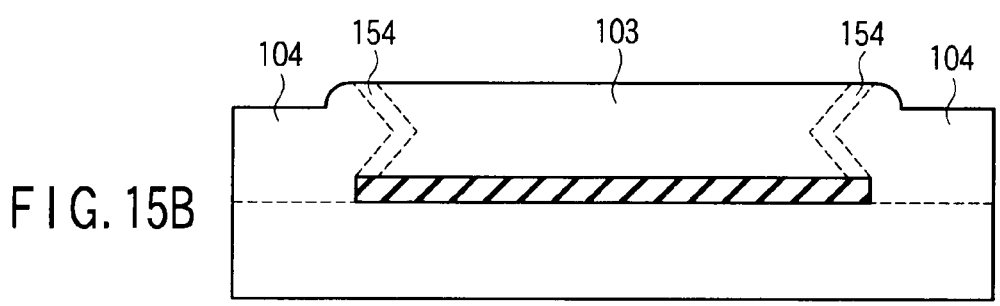
Figure 15C:
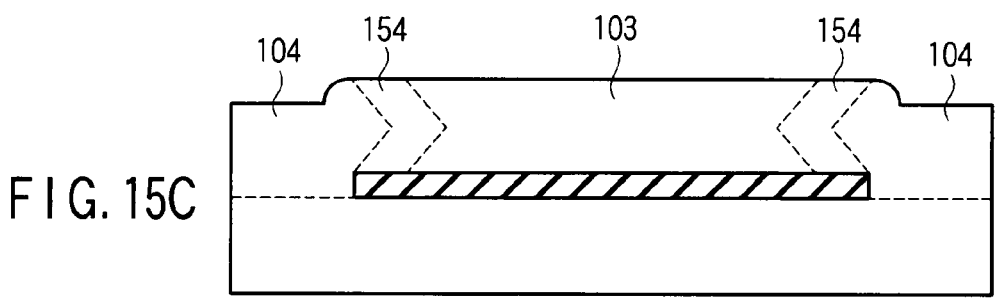
Figure 15D:
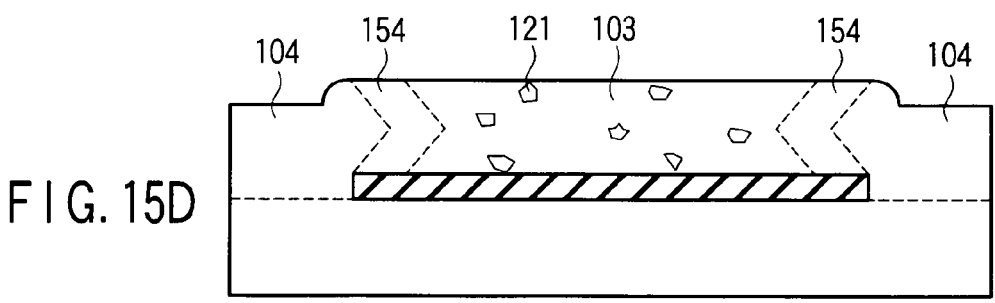
Figure 15E:
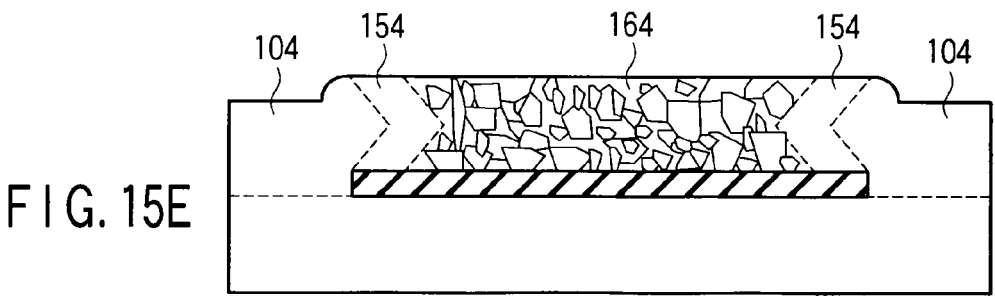

The reason why there is a difference in solid-phase-epitaxial growth rate is that the growth face at the time of progress of monocrystallization differs between a case where solid-phase-epitaxial growth proceeds in the <100> direction and a case where solid-phase-epitaxial growth proceeds in the <110> direction. Specifically, when solid-phase-epitaxial growth proceeds in the <100> direction, monocrystallization proceeds with a {110} plane at an angle of 45 degrees to the direction of growth as a growth face. In contrast, when solid-phase-epitaxial growth proceeds in the <110> direction, monocrystallization proceeds with a {111} plane at an angle of 54 degrees to the direction of growth as a growth face. When the {111} plane is a growth face, the growth rate in the <110> direction is low and twin crystals are liable to be formed on the face. As compared with a case where solid-phase-epitaxial growth is caused to proceed in the <100> direction, the solid-phase-epitaxial growth distance hardly increases in a case where solid-phase-epitaxial growth is caused to proceed in the <110> direction and, as shown in FIG. 15D, crystal nucleation 121 takes place as a result of heterogeneous nucleation in the amorphous region, with the result that polycrystallization proceeds.

Figure 14A:
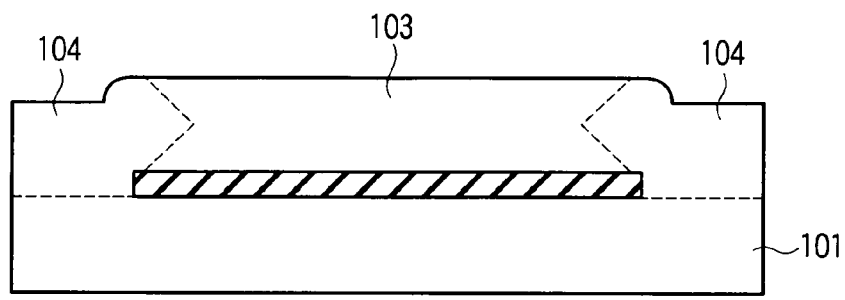
FIGS. 14A to 14E are sectional views to help explain solid-phase-epitaxial growth in the <100> direction.
Figure 14B:
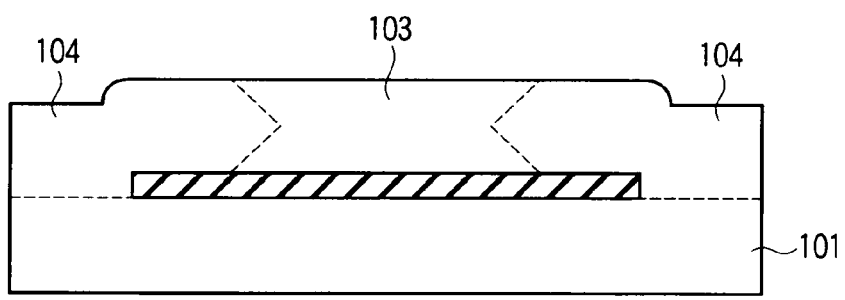
Figure 14C:
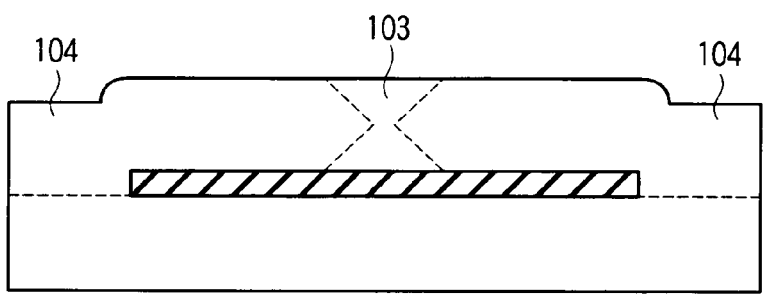
Figure 14D:
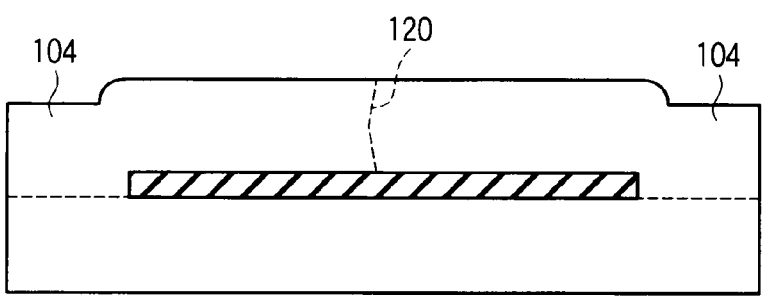
Figure 14E:
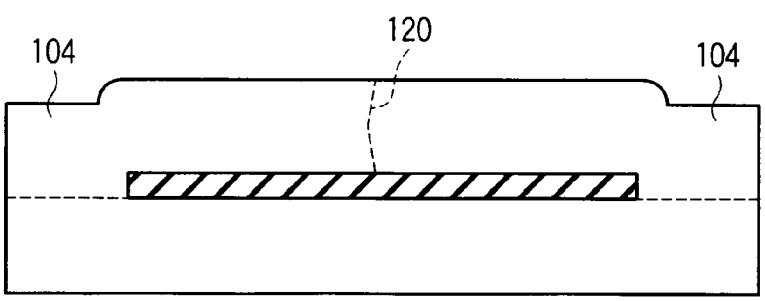

In FIG. 14D, a low-angle grain boundary 120 was observed in the position where the solid-phase-epitaxial growth regions extended from the adjacent seeds collided. The reason is that, although the seeds were monocrystals of the same orientation, the adjacent solid-phase-epitaxial growth regions tilted their orientations slightly in the middle of solid-phase-epitaxial growth and shifted from each other in the range of 3 degrees or less at the time of collision.

While in the first embodiment, the direction in which solid-phase-epitaxial growth proceeds is the <100> direction, the direction may actually tilt at an angle of 7 degrees to the <100> direction. Preferably, the direction is within the range of 3 degrees. The reason is that, as the angle to the <100> increases, the growth rate decreases. While the main surface of the silicon substrate is (100) plane, the direction is preferably within the range of 7 degrees, more preferably within the range of 3 degrees.

While in the first embodiment, the method of manufacturing memory cells each of which uses a floating gate electrode as a charge storage layer has been explained, the same method may be applied to such memory cells as MONOS cells each of which uses an insulating film, such as a silicon nitride film, as a charge storage layer.

Second Embodiment

In a second embodiment of the invention, the process of selectively growing a monocrystal region directly on the seed region is inserted into the processes of the first embodiment. As a result, the planarizing step in a later process can be eliminated. Moreover, not only can the solid-phase-epitaxial growth distance be made longer, but also a larger-area SOI region can be formed.

A method of manufacturing a memory cell part according to the second embodiment will be explained using FIGS. 16A to 16I. FIGS. 16A to 16I correspond to FIGS. 1A, 2A, . . . , 12A in FIGS. 1A to 1C to FIGS. 12A to 12C, each being a sectional view in the direction of channel length (the bit line direction). Since the plan view and the sectional view in the direction of channel width (the word line direction) are the same as those of FIGS. 1A to 12A, they are omitted.

First, as shown in FIG. 1A of the first embodiment, after a silicon oxide film 102 was formed on the surface of a p-type monocrystalline silicon substrate 101 of (001) plane orientation, a partial region of the silicon oxide film 102 was removed using a patterned resist (not shown) as a mask, thereby exposing a part of the silicon crystal substrate. Here, the pattern of the resist mask was made parallel to either the [100] direction or the [010] direction.

Figure 16A:
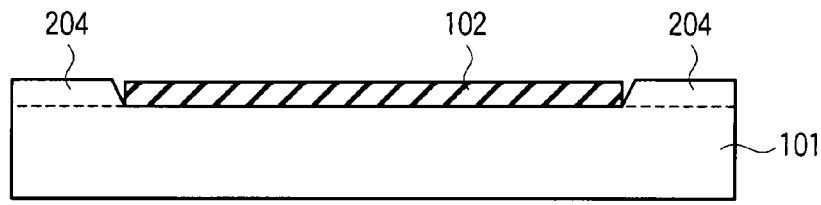
FIGS. 16A to 16I are sectional views to help explain nonvolatile semiconductor memory device manufacturing processes according to a second embodiment of the invention.

Next, as shown in FIG. 16A, a monocrystalline silicon film 204 was selectively grown only at the opening in the silicon oxide film 102 to the extent that its surface had the same thickness as that of the silicon oxide film 102. Here, the temperature of selective growth was 850° C. and a gaseous mixture of dichlorosilane by hydrogen carriers and hydrochloric acid was used as a gas for film formation. Since the silicon crystal layer 204 was selectively formed by vertical (film-thickness) epitaxial growth techniques, crystal grain boundaries or twin crystals were hardly observed, with the result that the silicon crystal layer had very excellent crystallinity.

Figure 16B:
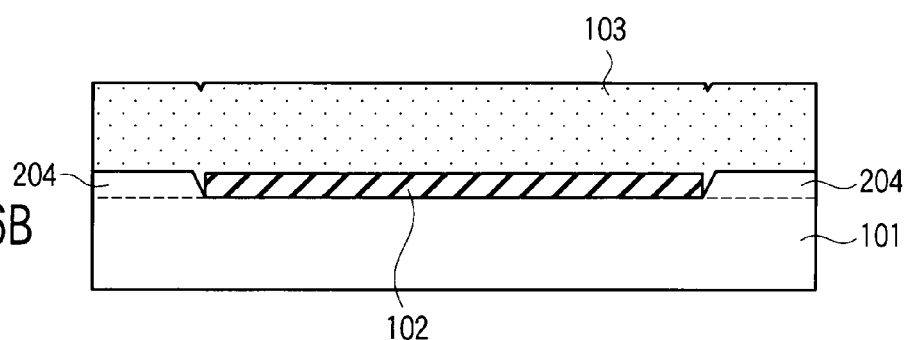

Next, as shown in FIG. 16B, an amorphous silicon film 103 was deposited to a thickness of 200 nm on the entire surface of the substrate 101. Here, the amorphous silicon film 103 was deposited at 550° C. using an LPCVD unit. To suppress the formation of a chemical oxide film at the interface between the amorphous silicon film 103 and monocrystalline silicon film 204, heat treatment was performed at 900° C. for one minute in a hydrogen atmosphere in the LPCVD unit before the deposition of the amorphous silicon film 103.

Figure 16C:
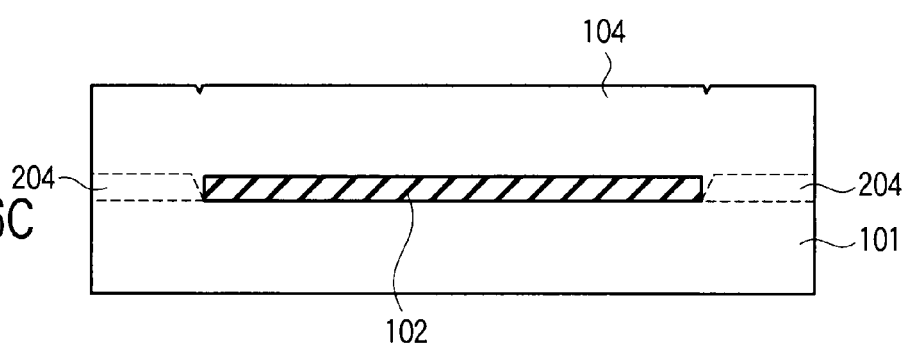

Next, the wafer was heat-treated at 650° C. for 30 minutes in a nitrogen atmosphere, thereby performing solid-phase-epitaxial growth using the monocrystalline silicon film 204 in contact with the amorphous silicon film 103 as a seed. As a result, the amorphous silicon film 103 was monocrystallized, thereby producing an SOI crystal layer 104 as shown in FIG. 16C. At this time, the rate at which the monocrystallization proceeded laterally from the seed was 2.1 μm/hour. After the solid-phase-epitaxial growth, when the crystallized state of the SOI crystal layer 104 was observed, it was recognized that distribution existed at high density.

Figure 16D:
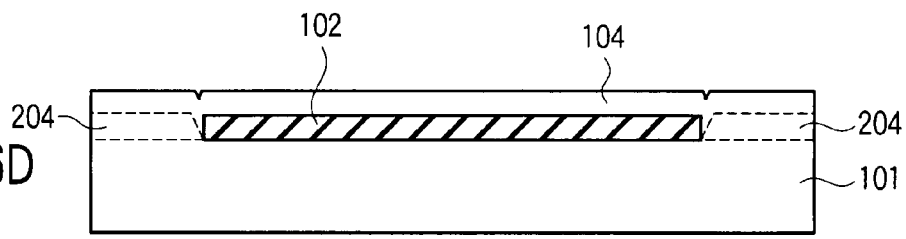
Figure 16E:
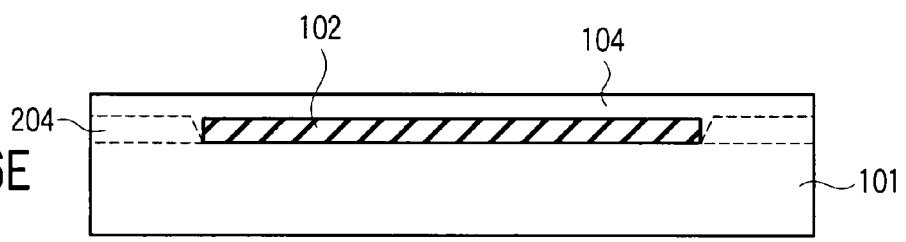

Next, the wafer was heat-treated for 180 minutes in an oxidizing atmosphere of 1050° C. By this process, the SOI crystal layer 104 was oxidized 150 nm from the surface. The thickness of the remaining crystalline SOI layer was 50 nm. This is a suitable film thickness to form a memory cell array on the SOI layer and operate it. Thereafter, the oxide film layer formed at the surface of the SOI crystal layer 104 was etched by hydrofluoric acid diluted with water. FIG. 16D shows the structure at that time. When the crystallized state of the SOI crystal layer 104 was observed after the heat treatment in the oxidizing atmosphere, it was recognized that high-density distribution which had been observed before the heat treatment were not detected at all.

As described in the first embodiment, distribution was decreased by such heat treatment.

Next, the surface of the wafer was polished again by CMP techniques. As a result, the steps observed at the surface of the SOI crystal layer 104 before heat treatment were made smaller. It was found that the steps about 3 nm high before heat treatment were decreased to 0.5 nm or less after the CMP process.

Figure 16F:
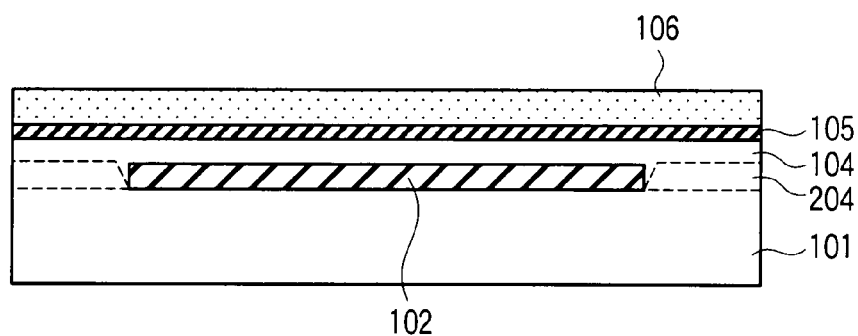

From this point on, as in the first embodiment, a gate insulating film (or a tunnel insulating film) 105 about 7 nm thick was formed on the entire surface by thermal oxidation techniques or the like and then a phosphorus-doped polysilicon layer 106 about 50 nm thick serving as a floating gate electrode was deposited by CVD techniques or the like as shown in FIG. 16F. Then, with a striped pattern resist (not shown) as a mask, the polysilicon layer 106, gate insulating film (tunnel insulating film), and a part of the SOI crystal layer were removed by RIE techniques or the like, thereby forming an element isolation trench 107.

Figure 16G:
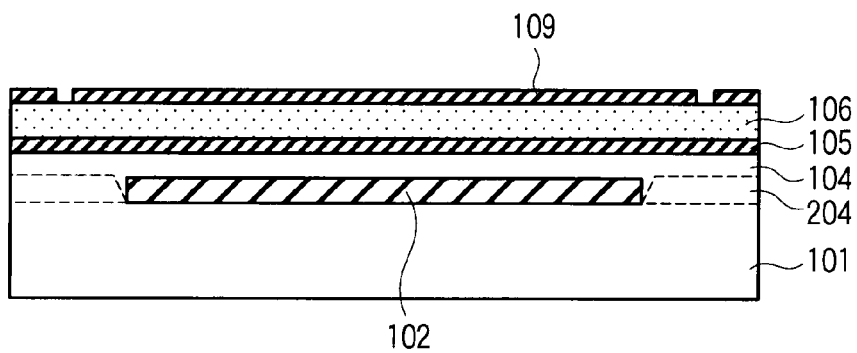
Figure 16H:
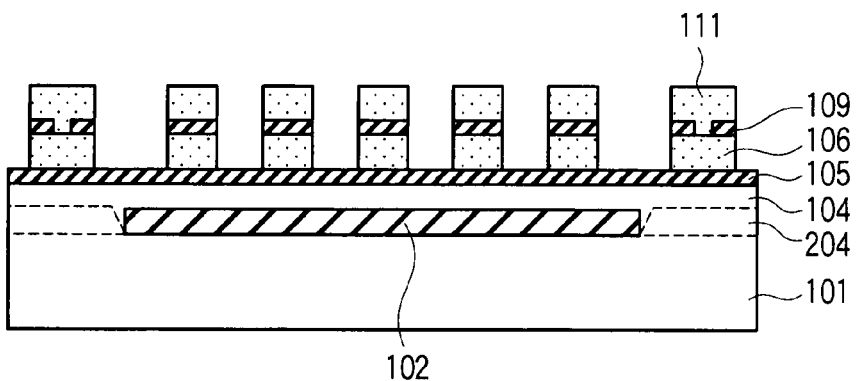
Figure 16I:
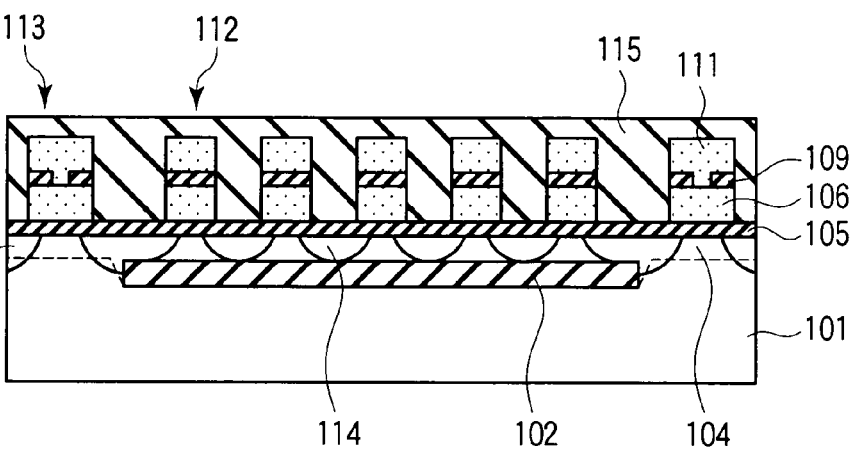

Next, by the same processes as those in the first embodiment, a memory cell array was formed on the SOI crystal layer as shown in FIGS. 16G to 16I.

While in FIG. 16I, the n-type impurity diffused layers 114 of the memory cell were isolated from one another, the invention is not necessarily limited to this. For example, as shown in FIG. 17, the n-type impurity memory layers 114 of the individual memory cells may be connected to one another.

Employing the processes according to the second embodiment causes irregularities in the surface to be made smaller at the time of formation of an amorphous silicon film, which makes unnecessary the CMP process of making large steps smaller. CMP for substantially polishing the surface can damage the surface. Therefore, it may be said that the method of the second embodiment is very useful in forming a memory cell array in a high yield.

Furthermore, since the part directly above the seed has already been monocrystallized at the start of heat treatment for solid-phase-epitaxial growth, the distance of monocrystallization by solid-phase-epitaxial growth before heterogeneous nucleation can be lengthened. Consequently, a larger-area SOI region can be formed.

Third Embodiment

In the third embodiment of the invention, in the process of selectively growing a monocrystal region directly above a seed region described in the second embodiment, the surface of the monocrystal region projects more than the surface of the insulating film. As a result, the solid-phase-epitaxial growth distance can be lengthened more than in the second embodiment, which enables a larger-area SOI region to be formed.

Figure 19C:
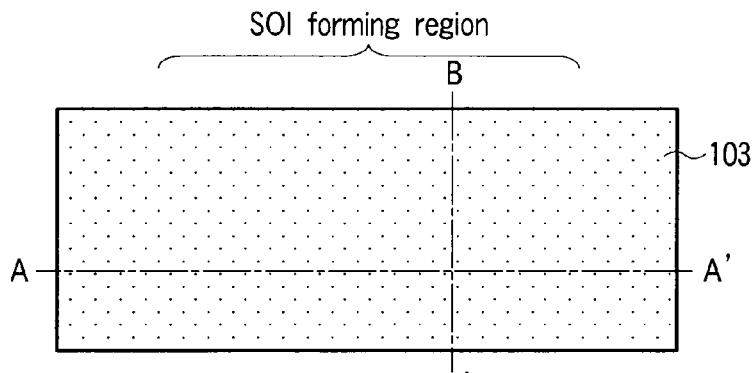
FIGS. 19A to 19C are sectional views and a plan view, respectively, to help explain nonvolatile semiconductor memory device manufacturing processes according to the third embodiment.
Figure 19A:
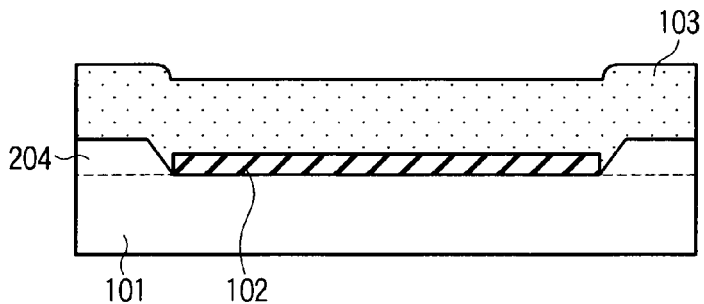
Figure 19B:
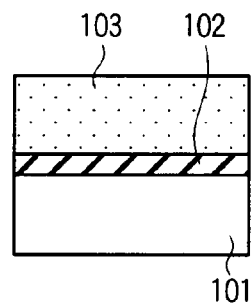

A method of manufacturing a memory cell part according to the third embodiment will be explained using FIGS. 18A to 18C and FIGS. 19A to 19C. In FIGS. 18A to 18C and FIGS. 19A to 19C, each of FIGS. 18A and 19A is a sectional view in the direction of channel length (the bit line direction), each of FIGS. 18B and 19B is a sectional view in the direction of channel width (the word line direction), and each of FIGS. 18C and 19C is a plan view. Moreover, each of FIGS. 18A and 19A is a sectional view taken along line A-A' of the corresponding plan view and each of FIGS. 18B and 19B is a sectional view taken along line B-B' of the corresponding plan view.

By the same processes of the second embodiment, a monocrystalline silicon film 204 was selectively grown only at the opening in the silicon oxide film 102 as shown in FIGS. 18A to 18C. At this time, its surface was made higher than that of the silicon oxide film 102. For example, the growth film thickness was set to 75 nm. Here, the temperature of selective growth was 850° C. and a gaseous mixture of dichlorosilane by hydrogen carriers and hydrochloric acid was used as a gas for film formation. Since the silicon crystal layer 204 was selectively formed by vertical (film-thickness) epitaxial growth techniques, crystal grain boundaries or twin crystals were hardly observed, with the result that the silicon crystal layer had very excellent crystallinity.

Next, as shown in FIGS. 19A to 19C, an amorphous silicon film 103 was deposited to a thickness of 200 nm on the entire surface of the substrate 101. Here, the amorphous silicon film 103 was deposited at 550° C. using an LPCVD unit. To suppress the formation of a chemical oxide film at the interface between the amorphous silicon film 103 and monocrystalline silicon film 204, heat treatment was performed at 900° C. for one minute in a hydrogen atmosphere in the LPCVD unit before the deposition of the amorphous silicon film 103.

In FIG. 16B of the second embodiment, concave portions were formed at the surface of the amorphous silicon film 103 at the boundary between the seed part and SOI part. In contrast, such concave portions are not found in FIGS. 19A to 19C of the third embodiment. In the third embodiment, the surface of the selectively grown monocrystal region is higher than that of the insulating film 102. Consequently, the time required for lateral solid-phase-epitaxial growth to start by heat treatment for solid-phase-epitaxial growth becomes shorter, with the result that a larger-area monocrystal layer can be obtained. Moreover, since there is no concave portion, a memory cell array can be formed even without a polishing process, such as CMP. Furthermore, while in the first embodiment, the film thickness of the deposited silicon layer may become thinner directly above the monocrystal, this problem does not occur in the third embodiment. That is, the method described in the third embodiment is very useful not only for the purpose of lengthening the solid-phase-epitaxial growth distance but also for the purpose of aligning the surfaces of the silicon layer in height.

Fourth Embodiment

In a fourth embodiment of the invention, an oxidizing atmosphere is used as the atmosphere at the time of solid-phase-epitaxial growth. This causes an oxide film to be formed at the amorphous silicon surface at the time of solid-phase-epitaxial growth, which not only suppresses the deterioration of the surface morphology but also supplies interstitial silicon during solid-phase-epitaxial growth. Therefore, in a state immediately after solid-phase-epitaxial growth, a monocrystal layer with good crystallinity can be obtained.

Figure 20C:
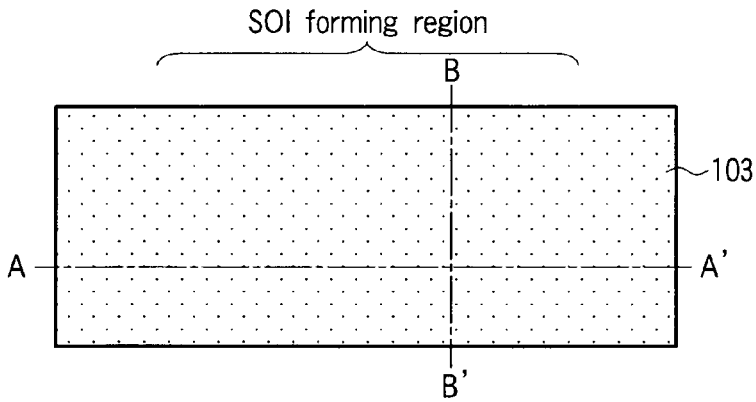
FIGS. 20A to 20C are sectional views and a plan view, respectively, to help explain nonvolatile semiconductor memory device manufacturing processes according to a fourth embodiment of the invention.
Figure 20A:
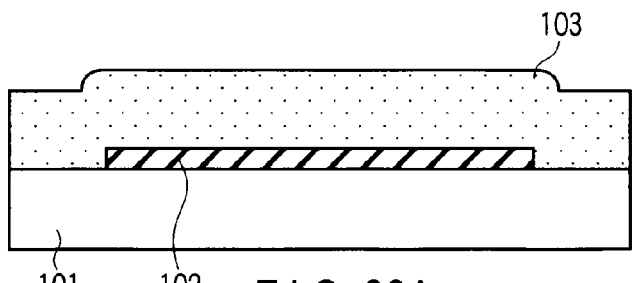
Figure 20B:
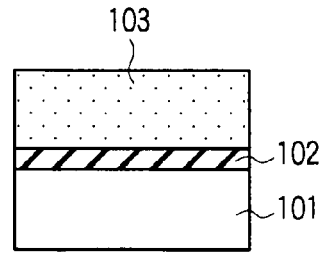
Figure 21C:
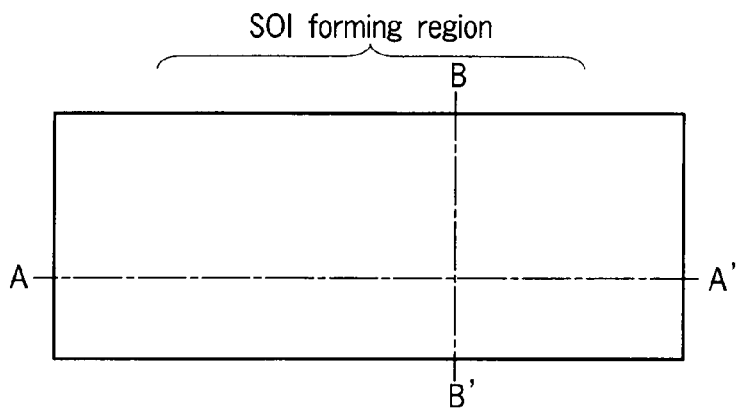
FIGS. 21A to 21C are sectional views and a plan view, respectively, to help explain nonvolatile semiconductor memory device manufacturing processes according to the third embodiment.
Figure 21A:
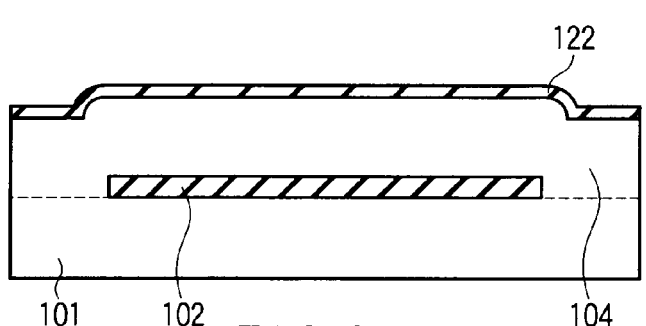
Figure 21B:
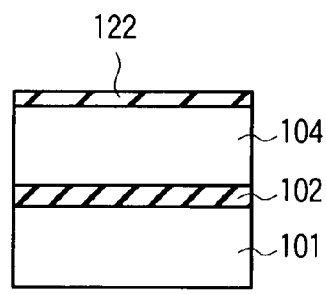

A method of manufacturing a memory cell part according to the fourth embodiment will be explained using FIGS. 20A to 20C and FIGS. 21A to 21C. In FIGS. 20A to 20C and FIGS. 21A to 21C, each of FIGS. 20A and 21A is a sectional view in the direction of channel length (the bit line direction), each of FIGS. 20B and 21B is a sectional view in the direction of channel width (the word line direction), and each of FIGS. 20C and 21C is a plan view. Moreover, each of FIGS. 20A and 21A is a sectional view taken along line A-A' of the corresponding plan view and each of FIGS. 20B and 21B is a sectional view taken along line B-B' of the corresponding plan view.

By the same process as described in the first embodiment, an amorphous silicon film 103 was deposited to a thickness of 200 nm on the entire surface of a substrate 101 as shown in FIGS. 20A to 20C.

Next, the wafer was heat-treated at 650° C. for 30 minutes in an oxygen atmosphere, thereby performing solid-phase-epitaxial growth, with a part of the monocrystal substrate 101 in contact with the amorphous silicon film 103 as a seed. As a result, the amorphous silicon film 103 was monocrystallized, producing an SOI crystal layer 104 as shown in FIGS. 21A to 21C. At this time, the rate at which monocrystallization progressed in the lateral direction from the seed was 2.1 µm/hour. Moreover, an oxide film 122 was formed on the surface of the SOI crystal layer 104.

When the crystallized state of the SOI crystal layer 104 was observed after the solid-phase-epitaxial growth, the existence of distribution was hardly observed. Therefore, even when heat treatment was not performed in a high-temperature oxidation atmosphere, a monocrystal thin film with good crystallinity was obtained. Moreover, by solid-phase-epitaxial growth in an oxidizing according to the fourth embodiment, an oxide film 122 is formed in the middle of growth. This is effective in keeping the surface smooth as a protective film of the surface. Accordingly, in the fourth embodiment, it is possible to form cell transistors which vary less in quality.

Fifth Embodiment

In a fifth embodiment of the invention, a reducing atmosphere, such as a nitrogen atmosphere, is used as the atmosphere at the time of solid-phase-epitaxial growth. This enables not only heterogeneous nucleation to be suppressed at the time of solid-phase-epitaxial growth but also a large-area SOI region to be formed by lengthening the solid-phase-epitaxial growth distance.

Figure 22C:
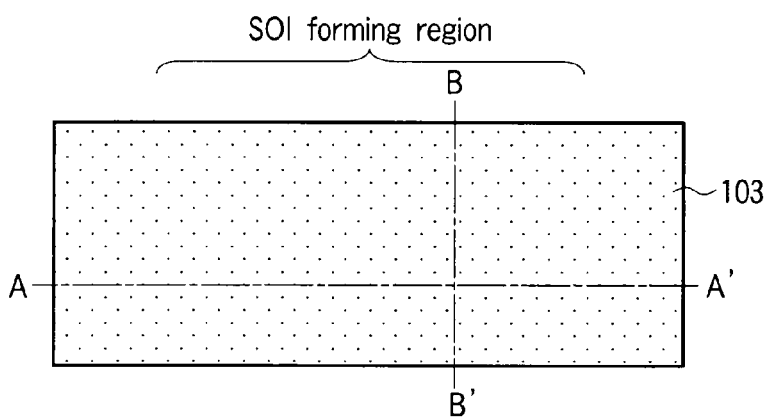
FIGS. 22A to 22C are sectional views and a plan view, respectively, to help explain nonvolatile semiconductor memory device manufacturing processes according to a fifth embodiment of the invention.
Figure 22A:
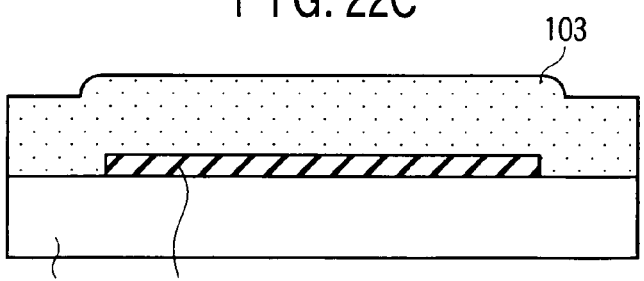
Figure 22B:
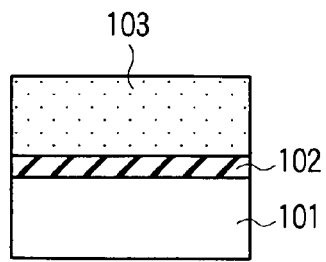

A method of manufacturing a memory cell part according to the fifth embodiment will be explained using FIGS. 22A to 22C and FIGS. 23A to 23C. In FIGS. 22A to 22C and FIGS. 23A to 23C, each of FIGS. 22A and 22A is a sectional view in the direction of channel length (the bit line direction), each of FIGS. 22B and 23B is a sectional view in the direction of channel width (the word line direction), and each of FIGS. 22C and 23C is a plan view. Moreover, each of FIGS. 22A and 23A is a sectional view taken along line A-A' of the corresponding plan view and each of FIGS. 22B and 23B is a sectional view taken along line B-B' of the corresponding plan view.

By the same process as described in the first embodiment, an amorphous silicon film 103 was deposited to a thickness of 200 nm on the entire surface of a substrate 101 as shown in FIGS. 22A to 22C.

Next, the wafer was heat-treated for 30 minutes at 650° C. in a hydrogen atmosphere, thereby performing solid-phase-epitaxial growth, with a part of the monocrystalline silicon substrate 101 in contact with the amorphous silicon film 103 as a seed. As a result, the amorphous silicon film 103 was monocrystallized, producing an SOI crystal layer 104 as shown in FIGS. 23A to 23C. At this time, the rate at which monocrystallization proceeded in the lateral direction from the seed was 1.5 μm/hour.

As described above, although the solid-phase-epitaxial growth rate becomes slower in a hydrogen atmosphere, the frequency of crystal nucleation also becomes lower, with the result that the amorphous region is not polycrystallized and is liable to be monocrystallized. That is, a reducing atmosphere, such as a hydrogen atmosphere, is used as the atmosphere at the time of solid-phase-epitaxial growth, enabling heterogeneous nucleation in the amorphous silicon film to be suppressed. This further increases the distance and area where monocrystallization can be performed by solid-phase-epitaxial growth.

Actually, when the time required for heterogeneous nucleation as shown in FIG. 15D started in amorphous silicon in heat treatment at 650° C. was examined, it was one hour and 45 minutes in a nitrogen atmosphere or an oxygen atmosphere and three hours and 30 minutes in a hydrogen atmosphere. As described above, although the growth rate decreases, the time required for heterogeneous nucleation to start is almost doubled, with the result that the area where monocrystallization can be performed by lateral solid-phase-epitaxial growth increases. Accordingly, a hydrogen atmosphere is important means for obtaining a large-area SOI crystal layer.

Sixth Embodiment

In a sixth embodiment of the invention, after an SOI crystal layer is monocrystallized by solid-phase-epitaxial growth, or after the implantation density in an SOI crystal layer is decreased by heat treatment in an oxidation atmosphere after solid-phase-epitaxial growth, heat treatment is performed in a reducing atmosphere, such as a hydrogen atmosphere, thereby realizing the planarization of the surface of the SOI crystal layer. Since a process which may leave polishing damage to the surface, such as a CMP process, need not be used, memory cells vary less in quality.

A method of manufacturing a memory cell part according to the sixth embodiment will be explained using FIGS. 24A to 24E. FIGS. 24A to 24E are sectional views in the direction of channel length (or the bit line direction). Plan views and sectional views in the direction of channel width (or the word line direction) are omitted.

Figure 24A:
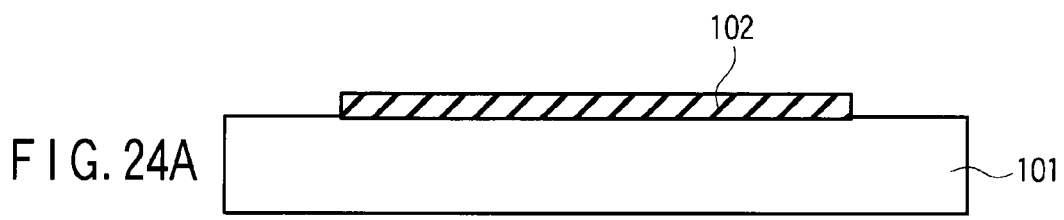
FIGS. 24A to 24E are sectional views to help explain nonvolatile semiconductor memory device manufacturing processes according to a sixth embodiment of the invention.

First, as shown in FIG. 24A, a silicon oxide film 102 was formed on the surface of a p-type monocrystalline silicon substrate 101 of (001) plane orientation. Then, with a patterned resist (not shown) as a mask, a partial region of the silicon oxide film was removed, thereby exposing a part of the silicon crystal substrate. Here, the pattern of the resist mask was made parallel to either the [100] direction or the [010] direction.

Figure 24B:
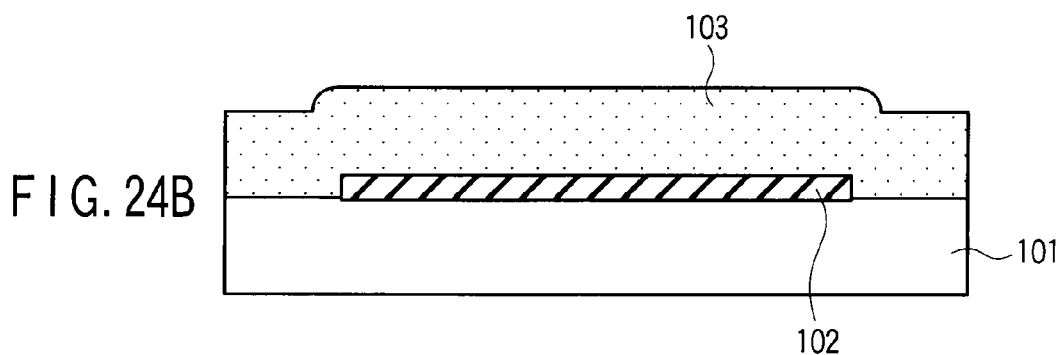

Next, as shown in FIG. 24B, an amorphous silicon film 103 was deposited to a thickness of 200 nm on the entire surface of the substrate 101. Here, the amorphous silicon film 103 was deposited at 550° C. using an LPCVD unit. To suppress the formation of a chemical oxide film at the interface between the amorphous silicon film 103 and substrate 101, heat treatment was performed at 900° C. for one minute in a hydrogen atmosphere in the LPCVD unit before the deposition of the amorphous silicon film 103.

As in the second embodiment, before the formation of the amorphous silicon film 103, a monocrystalline silicon film 204 may be selectively grown at the opening of the silicon oxide film 102 to the extent that its surface has the same thickness as that of the silicon oxide film 102.

Figure 24C:
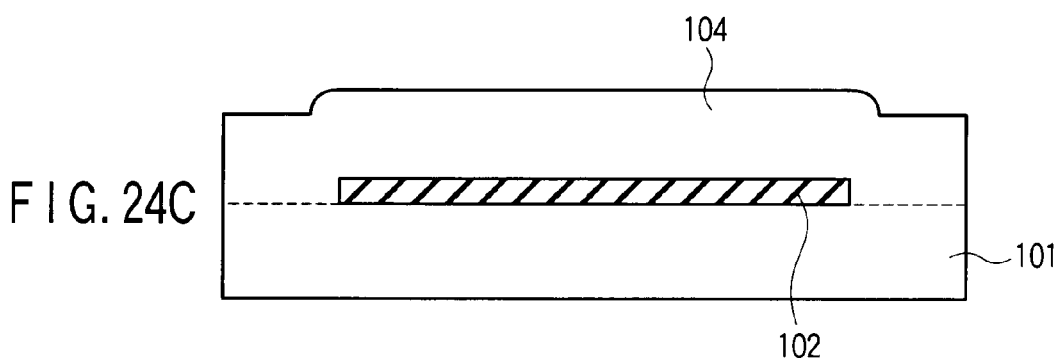

Next, the wafer was heat-treated at 650° C. for 30 minutes in a nitrogen atmosphere, thereby performing solid-phase-epitaxial growth using the monocrystalline silicon substrate 101 in contact with the amorphous silicon film 103 as a seed. As a result, the amorphous silicon film 103 was monocrystallized, thereby producing an SOI crystal layer 104 as shown in FIG. 24C. At this time, the rate at which the monocrystallization proceeded laterally from the seed was 2.1 μm/hour. After the solid-phase-epitaxial growth, when the crystallized state of the SOI crystal layer 104 was observed, it was recognized that distribution existed at high density.

Figure 24D:
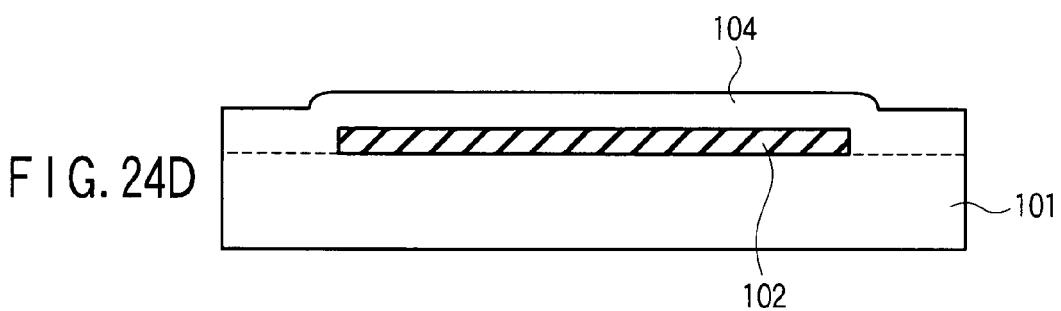

Next, the wafer was heat-treated for 100 minutes in an oxidizing atmosphere of 1050° C. By the process, the SOI crystal layer 104 was oxidized 150 nm from the surface. The thickness of the remaining crystalline SOI layer was 50 nm. This is a suitable film thickness to form a memory cell array on the SOI layer and operate it. Thereafter, the oxide film layer formed on the SOI crystal layer 104 was etched by hydrofluoric acid diluted with water. FIG. 24D shows the structure at that time.

Figure 24E:
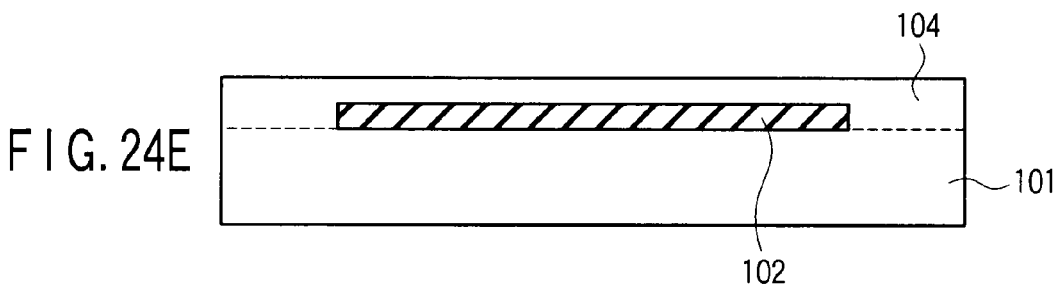

Next, the wafer was heat-treated at 1100° C. for three minutes in a hydrogen atmosphere. As shown in FIG. 24E, irregularities observed in the surface of the SOI crystal layer 104 before heat treatment were made smaller. It was found that the steps about 3 nm high before heat treatment were decreased to 0.5 nm or less in height after the heat treatment in a hydrogen atmosphere. The planarization by heat treatment in a hydrogen atmosphere resulted from an increase in the surface fluidity.

From this point on, by the same processes as those in the first embodiment, a nonvolatile semiconductor memory device with SOI-structure memory cells can be formed.

While in the sixth embodiment, heat treatment in a hydrogen atmosphere is performed after the thickness of the SOI layer has become 50 nm, it may be performed when the SOI layer has become much thicker. The surface planarization by heat treatment in a hydrogen atmosphere is effective in removing small irregularities. Therefore, surface planarization by heat treatment in a hydrogen atmosphere is also effective in planarizing the concave portions at the surface as shown in, for example, FIG. 16D of the second embodiment.

As described above, according to the sixth embodiment, the surface of the SOI crystal layer 104 can be smoothed by performing thermal treatment at a temperature higher than the solid-phase-epitaxial growth temperature in a reducing atmosphere, such as a hydrogen atmosphere, after monocrystallization by solid-phase-epitaxial growth or after heat treatment in an oxidizing atmosphere after monocrystallization. Accordingly, a process which may leave polishing damage to the surface, such as a CMP process, need not be used. This enables characteristic variations between cells to be suppressed and high cell current to be obtained.

Seventh Embodiment

In the seventh embodiment of the invention, a thin oxide film is formed between a silicon thin film and a seed part of a foundation substrate, causing the thin oxide film layer to function as a diffusion barrier, which enables a shallow junction to be formed even in a bulk region.

A method of manufacturing a memory cell part according to the seventh embodiment will be explained using FIGS. 25A to 25D. FIGS. 25A to 25D correspond to FIGS. 1A, 2A, . . . , 12A in FIGS. 1A to 1C to FIGS. 12A to 12C, each being a sectional view in the direction of channel length (or the bit line direction). Since the plan views and the sectional views in the direction of channel width (or the word line direction) are the same as those of FIGS. 1A to 1C to 12A to 12C to, they are omitted.

Figure 25A:
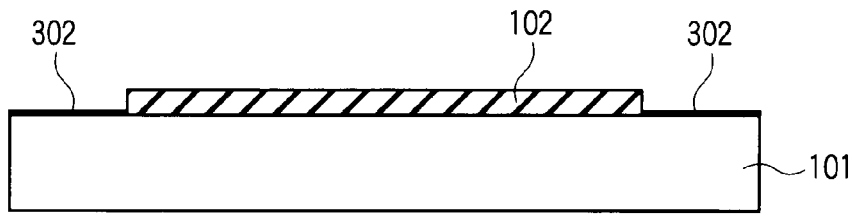
FIGS. 25A to 25D are sectional views to help explain nonvolatile semiconductor memory device manufacturing processes according to a seventh embodiment of the invention.

First, as shown in FIG. 25A, a 50-nm-thick silicon oxide film 102 was formed on a p-type monocrystalline silicon substrate 101 of (001) plane orientation. Then, a partial region of the silicon oxide film was removed using a patterned resist (not shown) as a mask, thereby exposing a part of the silicon crystal substrate. Here, the pattern of the resist mask was made parallel to either the [100] direction or the [010] direction.

Next, a thin oxide film 302 functioning as a barrier film was formed at the interface at the opening (or seed part) in the silicon oxide film 102. The oxide film 302 may be formed by the reaction in acid solution or by the reaction in gas-phase oxygen, water vapor, or the like. Solid-phase-epitaxial growth takes place via the interface where oxygen exists. To cause oxygen not to prevent solid-state growth completely because of solid-phase-epitaxial growth via the interface where oxygen exists, it is desirable that the surface density of oxygen should be $8 \times 10^{14}$ cm$^{-2}$ or less. There is no lower concentration limit to the surface density of oxygen in terms of solid-phase-epitaxial growth. However, to obtain a smooth surface, it is desirable that the surface density of oxygen should be $8 \times 10^{14}$ cm$^{-2}$ or more. The reason is that, although oxygen concentration of this order makes solid-phase-epitaxial growth slower temporarily at the interface, it enables not only an amorphous silicon film to be formed smoothly but also amorphous silicon to be monocrystallized by uniform solid-phase-epitaxial growth.

Furthermore, according to the method, since the removal of a chemical oxide film at the interface which requires a high-temperature process is not needed, the temperature of the processes can be lowered, which makes it possible to alleviate an adverse effect caused by the high-temperature processes on the elements already formed before the main processes. Moreover, although an amorphous silicon film has to be formed at a low temperature, the method of the seventh embodiment makes it unnecessary to make the temperature high, enabling the process time to be shortened.

Figure 25B:
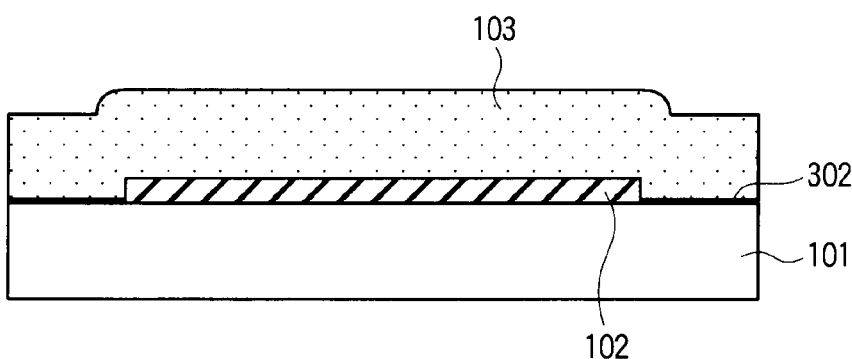

Next, as shown in FIG. 25B, an amorphous silicon film 103 was deposited to a thickness of 200 nm on the entire surface of the substrate 101.

Figure 25C:
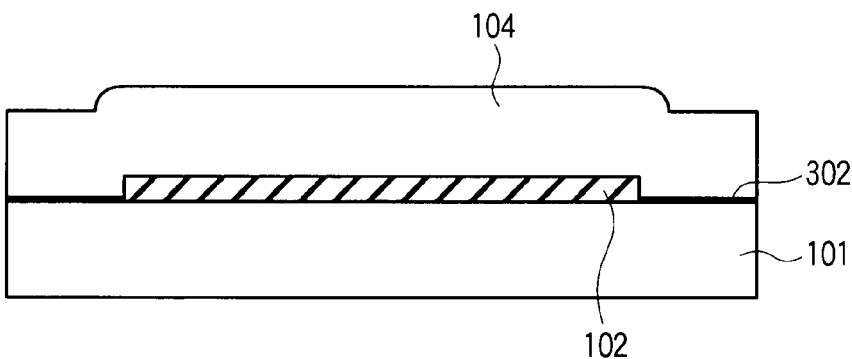

Next, as shown in the first embodiment, the wafer was heat-treated at 650° C. for 30 minutes in a nitrogen atmosphere, thereby performing solid-phase-epitaxial growth using a part of the silicon substrate 101 in contact with the amorphous silicon film 103 as a seed. As a result, the amorphous silicon film 103 was monocrystallized, thereby producing an SOI crystal layer 104 as shown in FIG. 25C.

Thereafter, as in the first embodiment, the SOI crystal layer 104 was smoothed by CMP techniques and then heat-treated in an oxidizing atmosphere. Moreover, a gate insulating film (tunnel insulating film) 105, a phosphorus-doped polysilicon layer 106 serving as a floating gate electrode, and a tungsten silicide layer 111 serving as a control gate electrode were formed. Then, an n-type impurity diffused layer 114 was formed by a combination of an ion implantation method and a thermal diffusion method or the like, thereby forming a memory cell as shown in FIG. 25D.

In the memory cell formed as described above, a thin oxide film 302 is formed immediately beneath the diffused layer of the seed part. The film 302 functions as an impurity diffusion barrier in the diffused layer. Accordingly, it is possible to shallow the junction of a MOSFET formed in the region above the seed part.

Figure 25D:
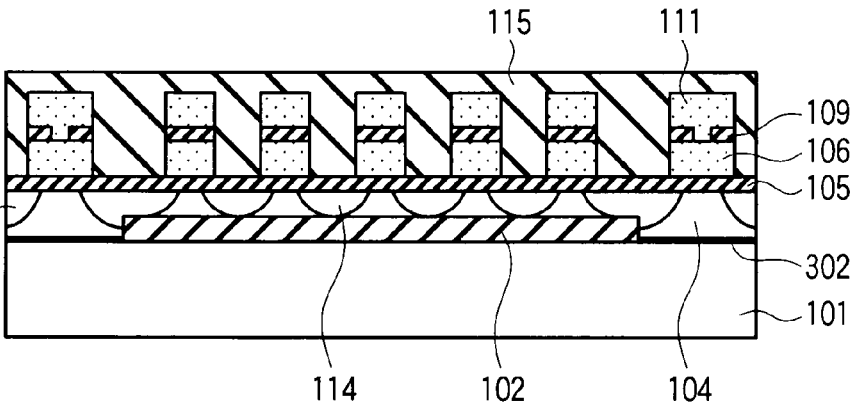
Figure 26:
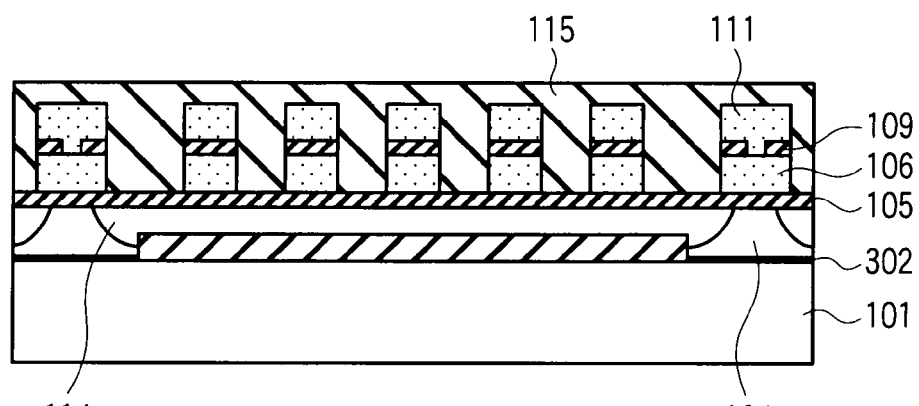
FIG. 26 is a sectional view showing the configuration of a nonvolatile semiconductor memory device according to a modification of the seventh embodiment.

While in FIG. 25D, the n-type impurity diffused layers 114 of the memory cell are isolated from one another, the invention is not necessarily limited to this. As shown in FIG. 26, the n-type impurity diffused layers 114 of the individual memory cells may be connected to one another.

Figure 27:
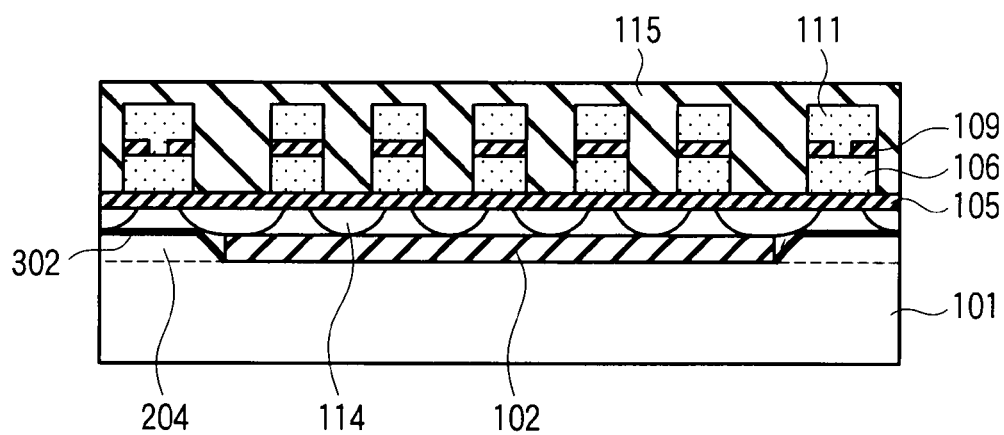
FIG. 27 is a sectional view showing the configuration of a nonvolatile semiconductor memory device according to another modification of the seventh embodiment.
Figure 28:
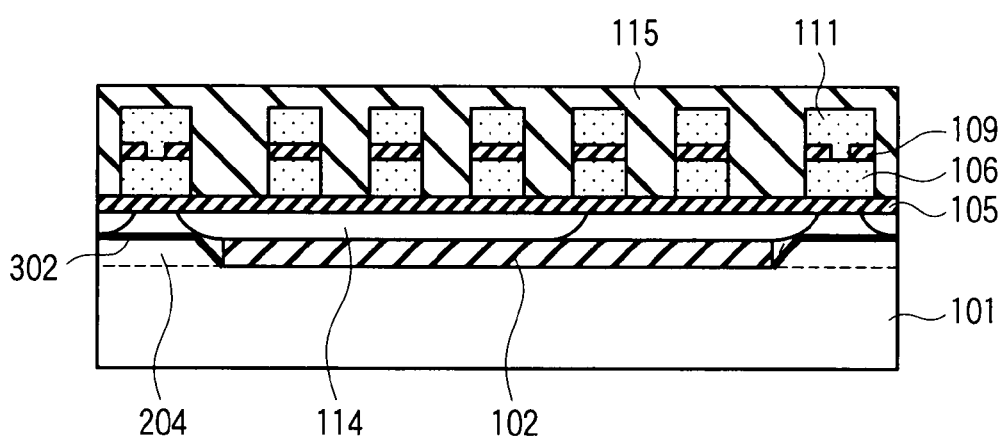
FIG. 28 is a sectional view showing the configuration of a nonvolatile semiconductor memory device according to still another modification of the seventh embodiment.

Furthermore, the seventh embodiment may be applied to the second embodiment where the seed part is raised. FIGS. 27 and 28 show the result of applying the seventh embodiment to the second embodiment. It is seen that a much shallower diffused layer 114 has been formed than that in FIG. 25D.

Eighth Embodiment

According to an eighth embodiment of the invention, there is provided a method of manufacturing a nonvolatile memory device with a SOI-structure memory cell part to solve the problems with a conventional equivalent. The eighth embodiment particularly provides a method of realizing ultrathin-film SOI-structure memory cells with excellent crystallinity so as not only to suppress characteristic variations between memory cells and realize high cell current but also suppress a short channel effect.

A method of manufacturing a memory cell part according to the eighth embodiment will be explained using FIGS. 29A to 29H. FIGS. 29A to 29H correspond to FIGS. 1A, 2A, . . . , 12A in FIGS. 1A to 1C to FIGS. 12A to 12C, each being a sectional view in the direction of channel length (or the bit line direction). Since the plan views and the sectional views in the direction of channel width (or the word line direction) are the same as those of FIGS. 1A to 12A, they are omitted.

First, as shown in FIG. 29A, a 45-nm-thick silicon oxide film 102 was formed on the surface of a p-type monocrystalline silicon substrate 101 of (001) plane orientation. Then, using silane ($SiH_4$) or disilane ($Si_2H_6$) and dinitrogen monoxide $N_2O$, an amorphous silicon film 403 with a trace of oxygen was formed to a thickness of about 20 nm. For example, an amorphous silicon film 403 with an oxygen concentration of about 5 to 10% can be obtained by forming the film at 525° C. for about 20 minutes in an atmosphere of 1 slm of gaseous $SiH_4$ and 50 sccm of gaseous $N_2O$ at about 100 Pa.

Then, the amorphous silicon film 403 containing impurities and a partial region of the oxide film 102 were removed using a patterned resist (not shown) as a mask, thereby exposing a part of the silicon substrate 101. Here, the pattern of the resist mask was made parallel to either the [100] direction or the [010] direction.

Next, as shown in FIG. 29B, an amorphous silicon film 103 was deposited to a thickness of 200 nm on the entire surface of the substrate. Here, the amorphous silicon film 103 was deposited at 550° C. using an LPCVD unit. To suppress the formation of a chemical oxide film at the interface between the amorphous silicon film 103 and substrate 101, 1:50 dilute hydrofluoric acid treatment was performed for about 30 seconds and then heat treatment was performed at 800° C. for one minute in a hydrogen atmosphere in the LPCVD unit before the deposition of the amorphous silicon film 103. Since the amorphous silicon film 403 contains oxygen as impurities, its crystallization temperature is high and therefore the amorphous silicon film does not become polysilicon and remains in an amorphous state.

Next, the wafer was heat-treated at 650° C. for 30 minutes in a nitrogen atmosphere, thereby performing solid-phase-epitaxial growth using the monocrystalline silicon substrate 101 in contact with the amorphous silicon film 103 as a seed. As a result, the amorphous silicon film 103 was monocrystallized, thereby producing an SOI crystal layer 104 as shown in FIG. 29C.

Figure 30A:
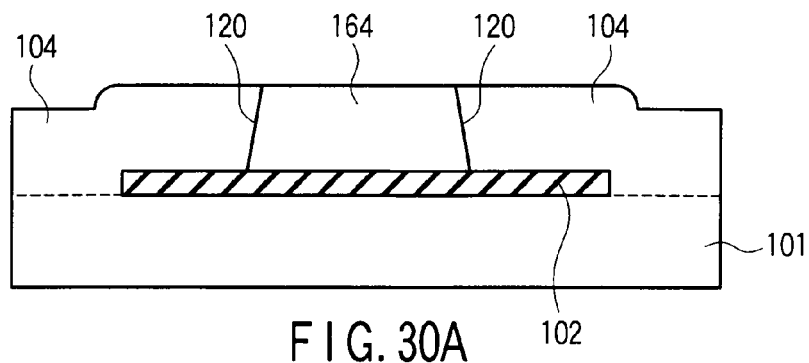
FIGS. 30A and 30B are sectional views to help explain the problem with the eighth embodiment.

In a method of growing the amorphous silicon film 103 directly on the silicon oxide film 102, crystal nuclei were frequently formed locally near the interface between the amorphous silicon film and the silicon oxide film 102. When such nuclei as determine the crystal orientation have been formed in the early stage of amorphous silicon film formation, solid-phase-epitaxial growth starts from there. Since the crystal nuclei formed on the oxide film 102 were random with respect to the rotation direction, the crystal face shifted from crystal growth from the seed layer, causing crystal defects. Accordingly, as shown in FIG. 30A, since polycrystallization progressed from below in a certain place and reached the top, the crystal growth did not proceed sufficiently, with the result that there was a place where polysilicon 164 was formed in the middle of the SOI layer.

Figure 30B:
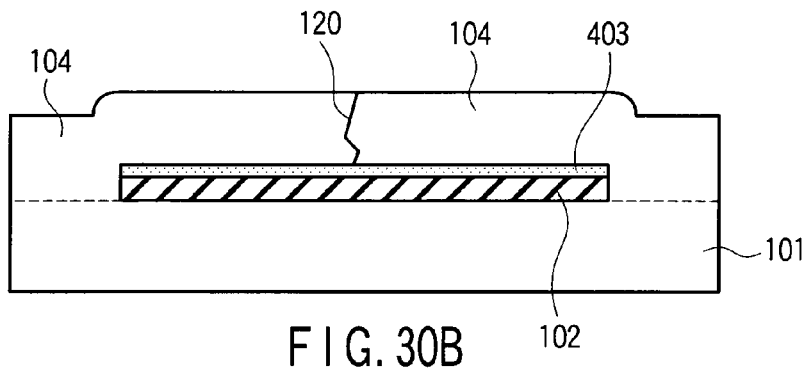

On the other hand, when the amorphous silicon film 403 containing impurities is formed on the oxide film 102, even if there are crystal nuclei at the interface between the impurity-contained silicon film 403 and the silicon oxide film 102, no crystallization takes place from below at the time of solid-phase-epitaxial growth because the crystallization temperature itself is high. Accordingly, as shown in FIG. 30B, a stable, long solid-phase-epitaxial growth distance can be secured.

Next, the surface of the wafer was polished and smoothed by CMP techniques. As a result, the film thickness above the SOI region was 120 nm and that directly above the seed was 100 nm, with the result that the 50-nm-high step between the place directly above the seed and that above the SOI region decreased to 20 nm.

Next, the wafer was heat-treated for 120 minutes in an oxidizing atmosphere of 1050° C. By the process, the SOI crystal layer 104 was oxidized 60 nm from the surface. The thickness of the remaining crystalline SOI layer was 60 nm. This is a suitable film thickness to form a memory cell array on the SOI layer and operate it. When the crystallized state of the SOI crystal layer 104 was observed after the heat treatment in the oxidizing atmosphere, it was recognized that high-density distribution observed before heat treatment were not detected at all. Moreover, by the high-temperature heat treatment, the amorphous silicon film containing oxygen as impurities is crystallized, producing a polysilicon film 404 with very small grains about 6 nm in diameter. Since defects and impurities in the silicon film 104 functioning as SOI are gettered efficiently in the polysilicon layer, the quality of the surface of the SOI crystal layer 104 becomes very high.

Next, the surface of the wafer was polished again by CMP techniques. As a result, the steps observed at the surface of the SOI crystal layer 104 before heat treatment became smaller. It was seen that a 20-nm-high step before heat treatment was decreased to 5 nm or less in height after the CMP process.

Figure 29E:
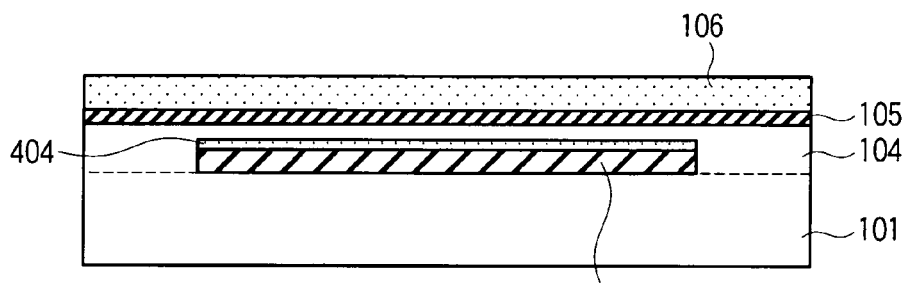

Next, as shown in FIG. 29E, a gate insulating film (or a tunnel insulating film) 105 about 7 nm thick was formed on the entire surface by the thermal oxidation method or the like. Moreover, a phosphorus-doped polysilicon layer 106 about 50 nm thick serving as a floating gate electrode was deposited by CVD techniques or the like.

Then, with a striped pattern resist (not shown) as a mask, the phosphorus-doped polysilicon layer, gate insulating film (tunnel insulating film), and a part of the SOI crystal layer were removed by RIE techniques or the like, thereby forming an element isolation trench 107.

Next, as in the first embodiment, a buried insulating film 108 was embedded in the element isolation trench region by coating techniques or the like. Since FIG. 29E is a sectional view in the direction of channel length (or the bit line direction), this part is not shown.

Figure 29F:
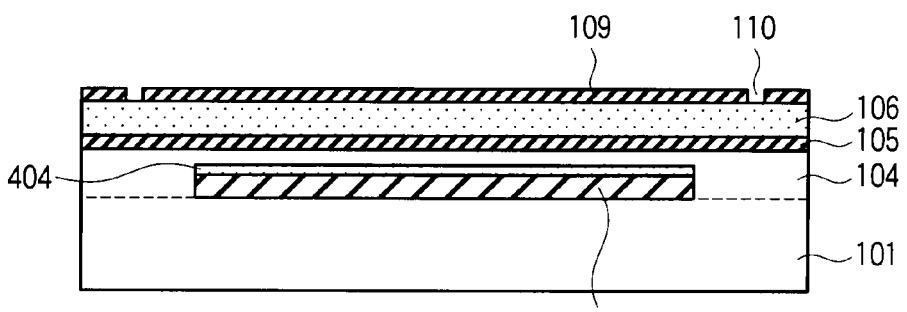

Next, as shown in FIG. 29F, an alumina film 109 about 15 nm thick serving as an interelectrode insulating film was formed on the entire surface by ALD techniques or the like. Then, with a patterned resist (not shown) as a mask, a slit part 110 about 50 nm wide was formed in a select gate transistor formation region by RIE techniques or the like, thereby exposing a part of the phosphorus-doped polysilicon layer 106.

Figure 29G:
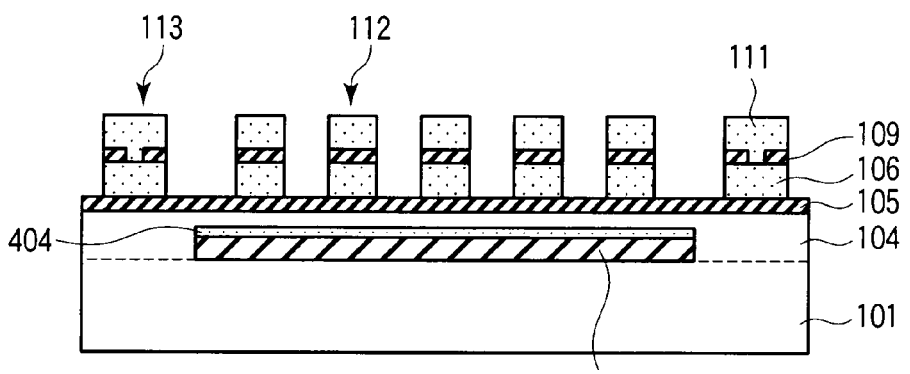

Next, as shown in FIG. 29G, a tungsten silicide layer 111 serving as a control gate electrode was formed on the entire surface by sputtering techniques or the like. At this time, at the slit part 110, the phosphorus-doped polysilicon layer 106 and tungsten silicide layer 111 were connected electrically. Thereafter, with the striped pattern resist (not shown) as a mask, the tungsten silicide layer 111, alumina film 109, and a part of the polysilicon layer 106 were removed by RIE techniques or the like, thereby forming a two-layer gate structure 112 of a memory cell and a stacked gate electrode structure 113 of a select gate transistor.

Figure 29H:
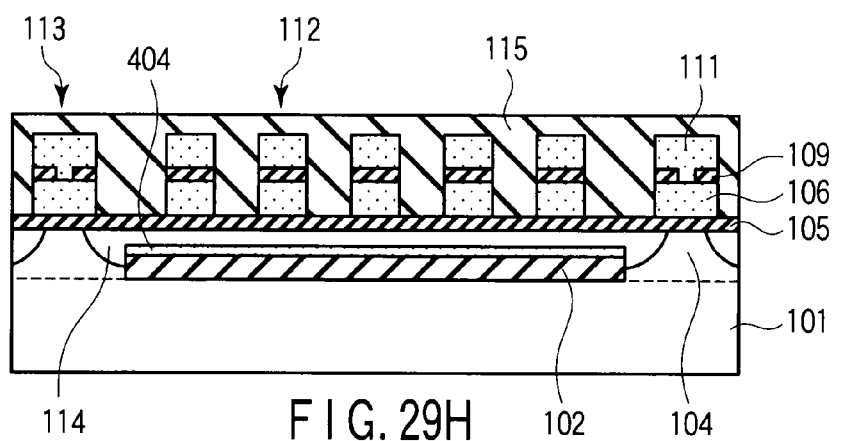

Next, as shown in FIG. 29H, an n-type impurity diffused layer 114 having a desired impurity concentration distribution was formed by a combination of ion implantation techniques and thermal diffusion techniques or the like. Then, an interlayer insulating film 115 was formed by CVD techniques or the like, thereby covering the two-layer structures 112 of the memory cells and the stacked gate electrode structures 113 of the select gate transistors with the interlayer insulating film 115. Moreover, openings were made in the top of the impurity diffused layers of the select gate transistors by a known method and a conductive material, such as tungsten, was embedded in the openings, thereby forming bit line contacts (and source line contacts, not shown).

Thereafter, a nonvolatile semiconductor memory device was completed by a known method.

Although the nonvolatile semiconductor device of the eighth embodiment has the polysilicon layer 404 containing oxygen as impurities between the SOI layer of the cell region and the buried oxide film layer, the channel part of the cell transistor at the surface of the SOI layer is excellent in crystallinity. Thus, a high cell on current can be obtained. Since the resistance of the polysilicon layer 404 containing oxygen as impurities is very high, the transistor off leakage current will never increase.

While in the eighth embodiment, oxygen has been used as impurities contained in the amorphous silicon film 403, carbon or nitrogen may be used as impurities to raise the crystallization temperature. When carbon is used as impurities, ethylene or the like may be used as dopant gas. When nitrogen is used as impurities, ammonia or the like may be used as dopant gas.

As described above, in the eighth embodiment, the oxide film 102 is formed on the silicon substrate 101. On the oxide film 102, the amorphous silicon film 403 containing impurities, such as oxygen, nitrogen, or carbon, is formed. Thereafter, openings are made in a region serving as a seed part in the amorphous silicon film 403 and silicon oxide film 102. Then, the amorphous silicon film 103 is grown in such a manner that solid-phase-epitaxial growth proceeds in the <100> direction with the openings as a seed.

Amorphous silicon containing impurities, such as oxygen, nitrogen, or carbon, is less liable to be crystallized than ordinary amorphous silicon containing no impurity. The effect of using impurity-added amorphous silicon was obtained at a concentration of $1 \times 10^{19}$ cm$^{-3}$ or more. The reason is that the crystallization of amorphous silicon has a dependence on impurity concentration. Consequently, as in the eighth embodiment, providing the amorphous silicon film 403 less liable to be crystallized at the interface between the silicon oxide film 102 and amorphous silicon film 103 prevents polycrystallization from below from impeding the solid-phase-epitaxial growth distance, which enables the solid-phase-epitaxial growth distance to increase.

Ninth Embodiment

According to a ninth embodiment of the invention, there is provided a method of not only improving the crystallinity of a semiconductor crystal layer but also suppressing a fluctuation in the memory cell characteristics due to the storage of carriers in the semiconductor crystal layer.

A method of manufacturing a memory cell part according to the ninth embodiment will be explained using FIGS. 31A to 31C and FIG. 40. In FIGS. 31A to 31C to FIGS. 39A and 39B, each of FIGS. 31A to 39A is a sectional view in the direction of channel length (the bit line direction), each of FIGS. 31B to 39B is a sectional view in the direction of channel width (the word line direction), and each of FIGS. 31C to 37C is a plan view. Moreover, each of FIGS. 31A to 39A is a sectional view taken along line A-A' of the corresponding plan view and each of FIGS. 31B to 39B is a sectional view taken along line B-B' of the corresponding plan view.

Figure 31C:
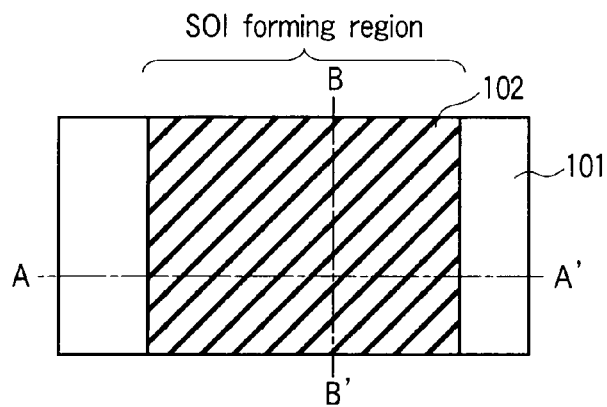
FIGS. 31A to 31C are sectional views and a plan view, respectively, to help explain nonvolatile semiconductor memory device manufacturing processes according to a ninth embodiment of the invention.
Figure 31A:
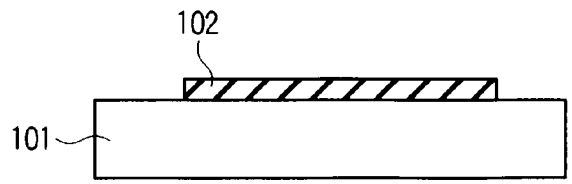
Figure 31B:
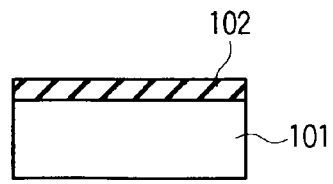

First, as shown in FIGS. 31A to 31C, a silicon oxide film 102 was formed to a thickness of about 50 nm on the surface of a p-type monocrystalline silicon substrate 101. Then, a partial region of the silicon oxide film 102 was removed using a patterned resist (not shown) as a mask, thereby exposing a part of the silicon crystal substrate.

Figure 32C:
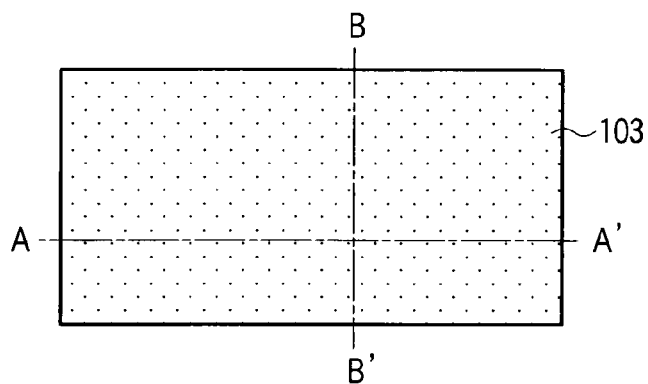
FIGS. 32A to 32C are sectional views and a plan view, respectively, to help explain nonvolatile semiconductor memory device manufacturing processes according to the ninth embodiment.
Figure 32A:
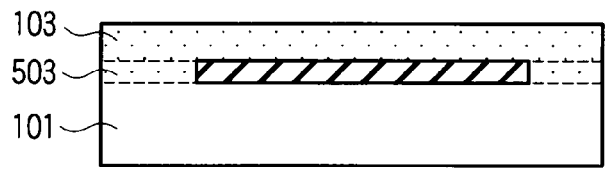
Figure 32B:
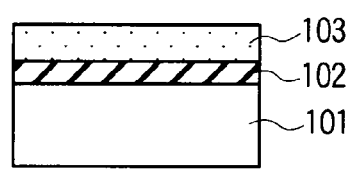

Next, as shown in FIGS. 32A to 32C, a first amorphous silicon film 503 was formed thicker than the silicon oxide film 102 by CVD techniques or the like. Then, with the silicon oxide film 102 as a stopper, CMP was performed so as to connect the amorphous silicon film 503 with the silicon oxide film 102 smoothly. Thereafter, a second amorphous silicon film 103 was formed to a thickness of about 100 nm by CVD techniques.

Figure 33C:
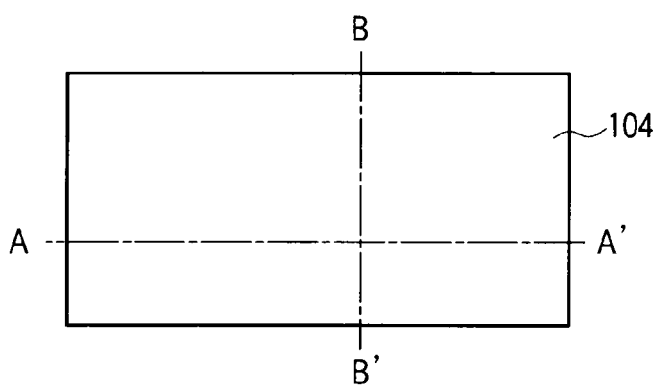
FIGS. 33A to 33C are sectional views and a plan view, respectively, to help explain nonvolatile semiconductor memory device manufacturing processes according to the ninth embodiment.
Figure 33A:
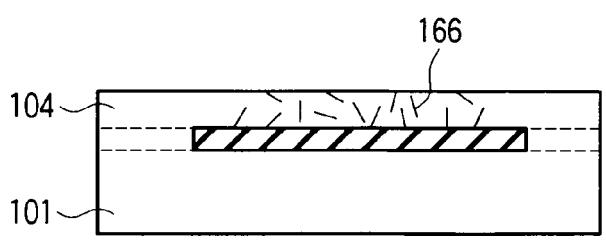
Figure 33B:
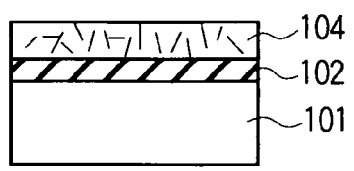

Thereafter, annealing was done at 600° C. for about two hours, thereby growing the amorphous silicon films 503, 103 in the solid phase on the basis of the silicon substrate 101, which produced a monocrystalline silicon layer (SOI crystal layer) 104 as shown in FIGS. 33A to 33C. Then, after high-temperature oxygen annealing was done at 1050° C. in an oxygen atmosphere, the formed oxide film was peeled by wet etching.

At this time, since the monocrystalline silicon layer 104 before annealing in an oxygen atmosphere was formed by solid-phase-epitaxial growth, the part closer to the silicon substrate 101 has fewer crystal defects 166. However, as the growth distance becomes longer, the silicon crystal includes more crystal defects 166. High-temperature oxygen annealing causes not only crystal defects to gather around the upper and lower interfaces of the silicon crystal but also the defects filled with silicon expelled by oxidation, which makes the crystal defects 167 smaller. The defects gathered around the upper interface of the silicon crystal are absorbed by the silicon oxide film 122 as a result of oxidation and disappear from the silicon crystal. Then, the silicon oxide film 122 is peeled and removed in a subsequent process.

Furthermore, since the vicinity of the silicon film part formed by solid-phase-epitaxial growth on the silicon substrate 101 is a silicon crystal with fewer crystal defects, the silicon crystal closer to the central part of the silicon oxide film 102 has more crystal defects. This produces an SOI crystal layer 104 where the crystal defect density is higher above the central part of the silicon oxide film 102 and at its lower interface. The crystal defects at this time include Si—H structures, line defects, and stacking faults.

Next, as shown in FIGS. 35A to 35C, a gate insulating film (or a tunnel insulating film) 105 about 7 nm thick was formed on the entire surface by thermal oxidation techniques or the like. Then, a phosphorus-doped polysilicon layer 106 about 50 nm thick serving as a floating gate electrode was deposited by CVD techniques or the like. Next, with a striped pattern resist (not shown) as a mask, the polysilicon layer 106, gate insulating film (tunnel insulating film) 105, silicon crystal layer 104, silicon oxide film layer 102, and a part of the silicon crystal substrate 101 were removed by RIE techniques or the like, thereby forming an element isolation trench.

Next, a buried insulating film 108 was embedded in the element isolation trench region by coating techniques or the like. For example, applying a coating insulating film made of polysilazane or the like enables the formation of an incompletely buried region termed a void to be avoided. The lower the permittivity of the buried insulating film 108, the more the withstand voltage between adjacent memory cells increases. For this reason, it is desirable that steam oxidation should be performed after the coating to eliminate impurities, including nitrogen, carbon, and hydrogen, in the insulating film 108 and turn the film into a silicon oxide film. Furthermore, to remedy crystal defects developed at the surface of the trench at the time of formation of the element isolation trench, thermal oxidation or radical oxidation may be performed before or after the coating insulating film 108 is embedded. Moreover, to improve the insulating properties of the buried insulating film 108, a combination of a CVD insulating film and a coating insulating film may be buried.

Figure 36C:
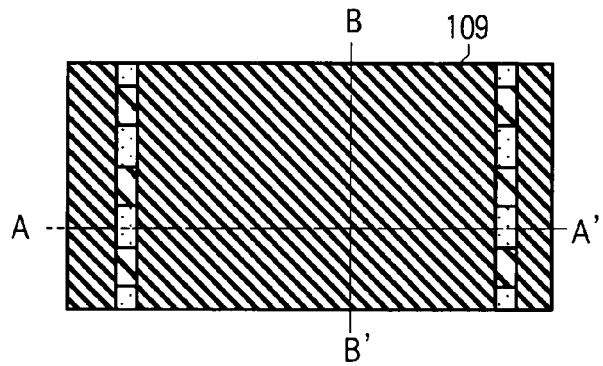
FIGS. 36A to 36C are sectional views and a plan view, respectively, to help explain nonvolatile semiconductor memory device manufacturing processes according to the ninth embodiment.
Figure 36A:
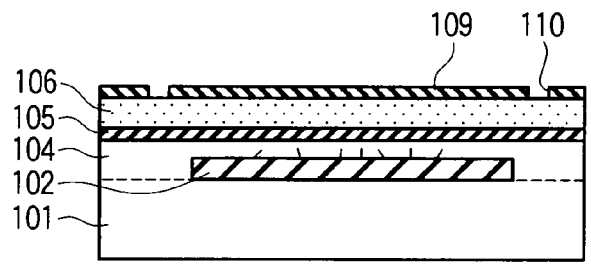
Figure 36B:
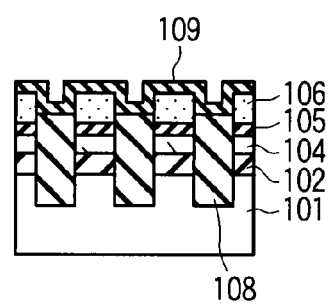

Next, as shown in FIGS. 36A to 36C, an alumina film 109 about 15 nm thick serving as an interelectrode insulating film was formed on the entire surface by ALD techniques or the like. Then, with a patterned resist (not shown) as a mask, a slit part 110 about 50 nm wide was formed in a select gate transistor formation region, thereby exposing a part of the phosphorus-doped polysilicon layer 106.

Figure 37C:
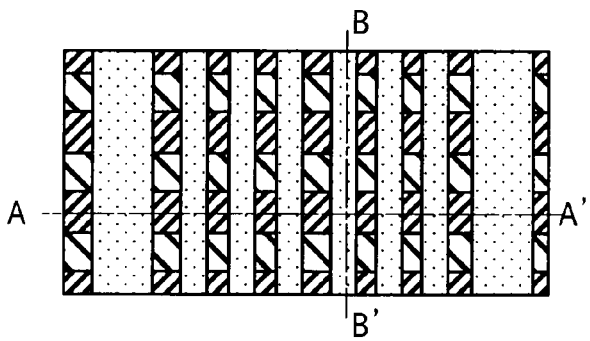
FIGS. 37A to 37C are sectional views and a plan view, respectively, to help explain nonvolatile semiconductor memory device manufacturing processes according to the ninth embodiment.
Figure 37A:
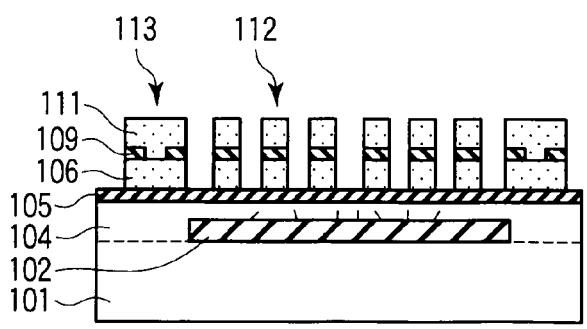
Figure 37B:
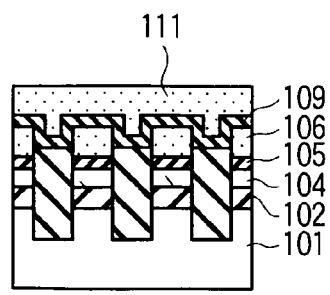

Next, as shown in FIGS. 37A to 37C, a tungsten silicide layer 111 serving as a control gate electrode was formed on the entire surface by sputtering techniques or the like. At this time, at the slit part 110, the polysilicon layer 106 and the tungsten silicide layer 111 were connected electrically. Thereafter, with the striped pattern resist (not shown) as a mask, the tungsten silicide layer 111, alumina film 109, and a part of the phosphorus-doped polysilicon layer 106 were removed by RIE techniques or the like, thereby forming a two-layer gate structure 112 of a memory cell and a stacked gate electrode structure 113 of a select gate transistor.

At this time, the boundary between the SOI region and the non-SOI region is below the part between the one of the two-layer gate structures 112 of the memory cell closest to the stacked gate structure 113 of the select gate transistor and the stacked gate electrode structure 113 of the select gate transistor or below the stacked gate electrode structure 113 of the select gate transistor.

Figure 38A:
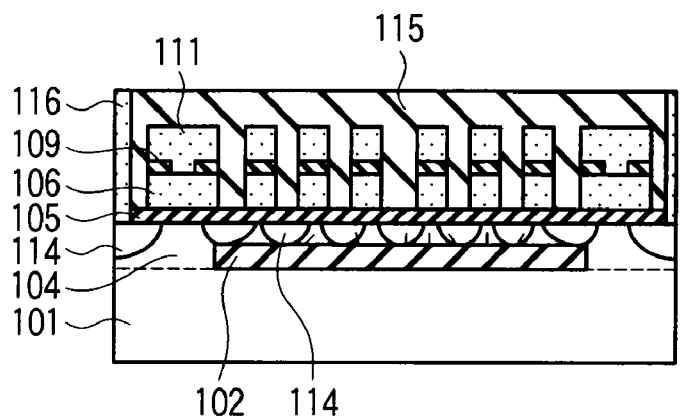
FIGS. 38A and 38B are sectional views to help explain nonvolatile semiconductor memory device manufacturing processes according to the ninth embodiment.
Figure 38B:
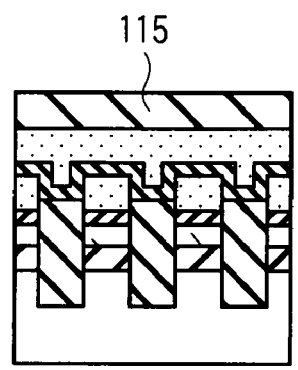

Next, as shown in FIGS. 38A and 38B, an n-type impurity diffused layer 114 having a desired impurity concentration distribution was formed by a combination of ion implantation techniques and thermal diffusion techniques or the like. Then, an interlayer insulating film 115 was formed by CVD techniques or the like, thereby covering the two-layer structures of the memory cells and the stacked gate electrode structures 113 of the select gate transistors with the interlayer insulating film 115. Moreover, openings were made in the top of the impurity diffused layers of the select gate transistors by a known method and a conductive material, such as tungsten, was embedded in the openings, thereby forming bit line contacts 116 (and source line contacts). Thereafter, a nonvolatile semiconductor memory device was completed by a known method.

Figure 39A:
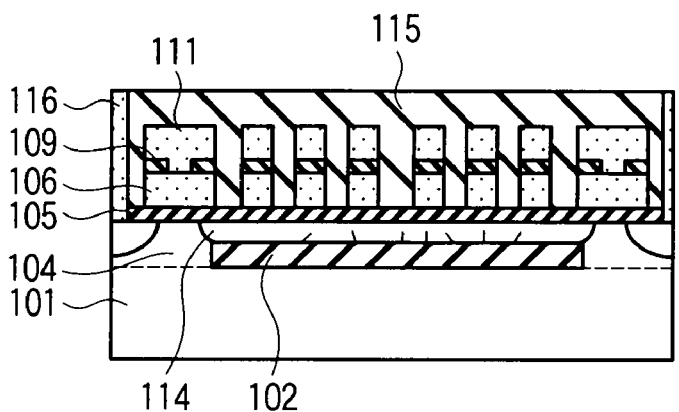
FIGS. 39A and 39B are sectional views showing the configuration of a nonvolatile semiconductor memory device according to a modification of the ninth embodiment.
Figure 39B:
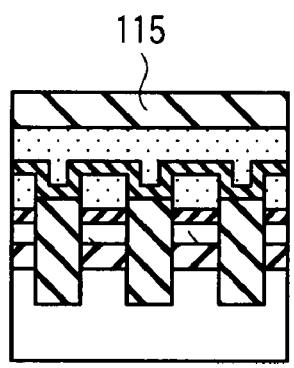
Figure 40:
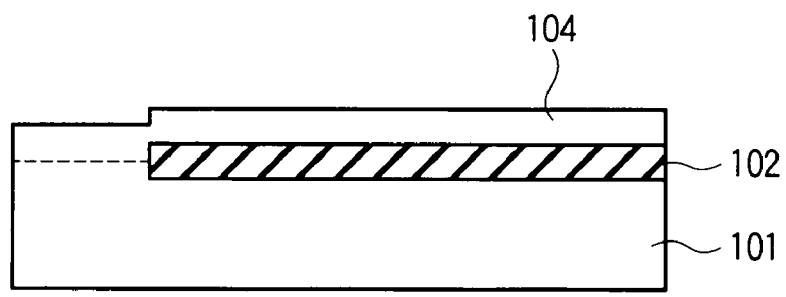
FIG. 40 is a sectional view showing the configuration of a nonvolatile semiconductor memory according to another modification of the ninth embodiment.

While in FIGS. 38A and 38B, the n-type impurity diffused layers 114 of the memory cell are isolated from one another, the invention is not necessarily limited to such a structure. For example, as shown in FIGS. 39A and 39B, the n-type impurity diffused layers 114 of the individual memory cells may be connected to one another.

As described above, the SOI crystal layer of the memory cell formed in the ninth embodiment has defects at the silicon intracrystalline lower interface. Since the defects include Si—H structures, stacking faults, and line defects, they act as the generation-recombination center of carriers. Therefore, in an erase operation of the memory cell, that is, at the time of transfer of electrons from the floating gate electrode to the SOI crystal layer 104, a fluctuation in the potential caused by an increase in the electron density of the n-type impurity diffused layer 114 is almost negligible. Accordingly, an erroneous operation of the nonvolatile semiconductor memory device can be avoided effectively.

The silicon crystal in the vicinity of the tunnel oxide film has fewer defects and is a region containing less hydrogen as a result of oxidation. Therefore, not only can the deterioration of the tunnel characteristic caused by defects be suppressed, but also Si—H bonds decrease and a reduction in the mobility can be suppressed.

Furthermore, in the ninth embodiment, the stacked structure 113 of the select gate transistor is formed in the non-SOI region outside the SOI formation region. Since there are fewer defects at the silicon intracrystalline lower interface of the SOI crystal layer 104 in the vicinity of the non-SOI region, there are fewer defects under the stacked structure 113, resulting in good crystallinity. Accordingly, the junction leakage of the select gate transistor can be reduced sufficiently, which makes it possible to avoid an erroneous operation of the nonvolatile semiconductor memory device in a read operation or the like.

Moreover, while in the ninth embodiment, the surface of the non-SOI region serving as the select gate transistor part is almost aligned with the surface of the SOI region in height as shown in FIGS. 32A to 32C, the invention is not necessarily limited to this. The heights of the surfaces of the two regions may differ. For example, as shown FIG. 40, the select gate transistor part may be made lower than the memory cell part without subjecting the SOI crystal layer 104 to CMP.

Additionally, while in the ninth embodiment, the method of manufacturing memory cells using a charge storage layer as a floating gate has been explained, a similar method may be applied to such memory cells as MONOS cells where an insulating film, such as a silicon nitride film, is used as a charge storage layer.

Tenth Embodiment

According to a tenth embodiment of the invention, there is provided an SOI-structure memory cell capable of suppressing a fluctuation in the memory cell characteristics caused by the accumulation of carriers in a semiconductor crystal layer and avoiding an erroneous operation of a nonvolatile semiconductor memory device and a method of realizing the SOI-structure memory cell.

Figure 41C:
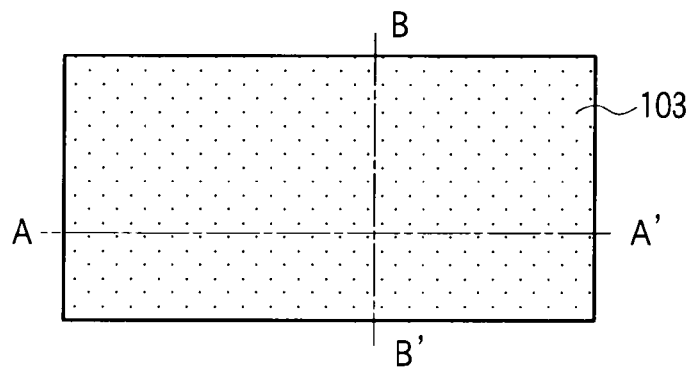
FIGS. 41A to 41C are sectional views and a plan view, respectively, to help explain nonvolatile semiconductor memory device manufacturing processes according to a tenth embodiment of the invention.
Figure 41A:
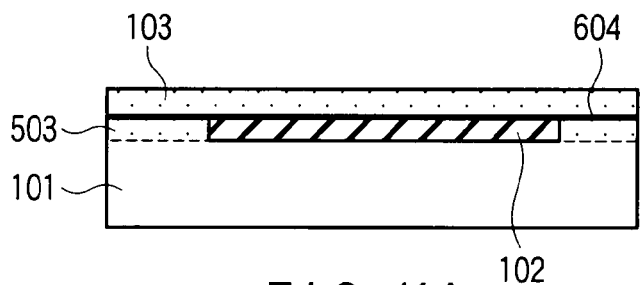
Figure 41B:
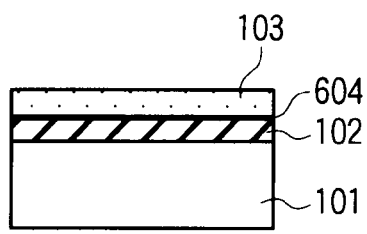
Figure 42C:
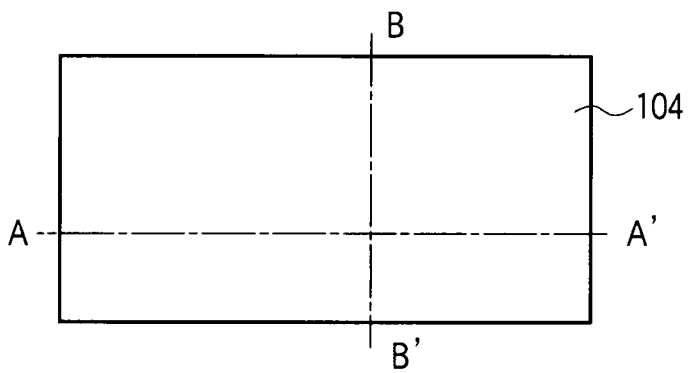
FIGS. 42A to 42C are sectional views and a plan view, respectively, to help explain nonvolatile semiconductor memory device manufacturing processes according to the tenth embodiment.
Figure 42A:
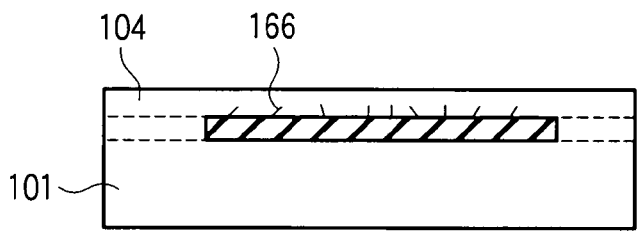
Figure 42B:
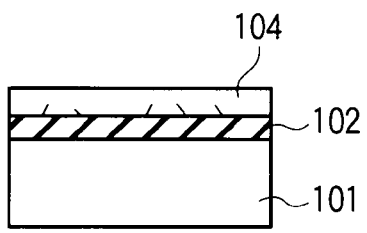

The structure of a memory cell part according to the tenth embodiment will be explained using FIGS. 41A to 41C and FIGS. 42A to 42C. In FIGS. 41A to 41C and FIGS. 42A and 42B, each of FIGS. 41A and 42A is a sectional view in the direction of channel length (the bit line direction), and each of FIGS. 41B to 42B is a sectional view in the direction of channel width (the word line direction). Moreover, each of FIGS. 41B to 42B is a sectional view taken along line B-B' of the corresponding plan view.

In the tenth embodiment, too, the structure described in FIGS. 32A to 32C are formed by the same processes as in the ninth embodiment. Thereafter, silicon is ion-implanted in the vicinity of the interface between the amorphous silicon film 103 and the silicon oxide film 102, thereby forming a damage layer 604 on the underside of the amorphous silicon film 103 as shown in FIGS. 41A to 41C.

Thereafter, annealing is done at 600° C. for about two hours, thereby growing the amorphous silicon films 503, 103 in the solid phase, which produces a monocrystalline silicon layer (SOI crystal layer) 104. Then, annealing is done at 1000° C. in a hydrogen atmosphere to gather the damage layer 604, thereby generating crystal defects 166, such as line defects or stacking faults, at the interface between the SOI crystal layer 104 and silicon oxide film 102.

While in the tenth embodiment, silicon ions have been implanted, implanted ions may be germanium, phosphorus, arsenic, or antimony. With these ions, a damage layer 604 can be formed sufficiently in the silicon crystal layer 104.

The subsequent processes are the same as those in the ninth embodiment.

As described above, in the tenth embodiment, as a result of the occurrence of line defects and stacking faults in the SOI crystal layer 104, the generation-recombination center of carriers develops in the silicon crystal layer. The electron density decreases rapidly under the effect of the generation-recombination center of carries. Therefore, in an erase operation of the memory cell, that is, at the time of transfer of electrons from the floating gate electrode to the SOI crystal layer 104, a fluctuation in the potential caused by an increase in the electron density of the n-type impurity diffused layer 114 is almost negligible. Accordingly, an erroneous operation of the nonvolatile semiconductor memory device can be avoided effectively.

Additionally, while in the tenth embodiment, the method of manufacturing memory cells using a charge storage layer as a floating gate has been explained, a similar method may be applied to such memory cells as MONOS cells where an insulating film, such as a silicon nitride film, is used as a charge storage layer.

(Modifications)

This invention is not limited to the above embodiments. While in the embodiments, a region monocrystallized by solid-phase-epitaxial growth is such that silicon is deposited in an amorphous state in all the region and the region is grown in the solid state, the region may be formed as described in the following item (1) or (2):

(1) After a silicon film is deposited in an amorphous state, heat treatment is performed according to a thermal history where the temperature is higher and the time is longer than when amorphous silicon is crystallized, silicon or germanium is ion-implanted to bring the film into an amorphous state again, and heat treatment is performed for solid-phase-epitaxial growth. Since this increases the density of amorphous silicon at the time of solid-phase-epitaxial growth, volume constriction does not take place at the time of solid-phase-epitaxial growth, with the result that the solid-phase-epitaxial growth rate becomes greater. Accordingly, the distance and area where monocrystallization can be preformed by solid-phase-epitaxial growth can be increased.

(2) After a region monocrystallized by solid-phase-epitaxial growth is deposited in a polycrystalline state, silicon or germanium is ion-implanted to bring the region into an amorphous state again, followed by heat treatment for solid-phase-epitaxial growth. Use of this process makes it possible to obtain higher-density amorphous silicon than when the region is deposited in an amorphous state. Therefore, volume constriction does not take place at the time of solid-phase-epitaxial growth, a greater solid-phase-epitaxial growth rate is obtained, the solid-phase-epitaxial growth distance increases, and a large-area thin-film SOI crystal layer can be formed.

Furthermore, while in the embodiments, nonvolatile memory cells of a two-layer gate structure have been used, the invention is not limited to this type of cell structure and may be applied to various types of nonvolatile memory cells. Moreover, the invention is not necessarily restricted to nonvolatile memory devices and may be applied to other various types of semiconductor memory devices, including DRAM.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of manufacturing a semiconductor memory device, comprising:

making an opening in a part of an insulating film formed on a silicon substrate which has {100} plane orientation as a main surface;

forming an amorphous silicon thin film on the insulating film in which the opening has been made and inside the opening;

forming a monocrystalline silicon layer by changing the amorphous silicon thin film in to a monocrystal in the <100> direction by solid-phase-growth, with the opening as a seed;

thinning the crystal layer by heat-treating the monocrystalline silicon layer in an oxidizing atmosphere; and forming a memory cell array on the monocrystalline silicon layer subjected to the thinning process.

2. The method according to claim 1, further comprising: before forming the amorphous silicon thin film, forming a monocrystalline silicon film inside the opening by selective growth so as to be buried in the opening and, after forming the amorphous silicon thin film, performing the solid-phase-epitaxial growth with the monocrystalline silicon film in the opening as a seed.

3. The method according to claim 2, further comprising: making the top surface of the monocrystalline silicon film higher than the top surface of the insulating film when the monocrystalline silicon film is formed inside the opening so as to be buried in the opening.

4. The method according to claim 1, further comprising: before forming the amorphous silicon thin film, depositing an amorphous silicon film on the insulating film and inside the opening and polishing the amorphous silicon film until the surface of the insulating film is exposed, thereby forming an amorphous silicon film in the opening so as to be buried in the opening.

5. The method according to claim 1, wherein the atmosphere in which the monocrystalline silicon layer is formed at the time of solid-phase-epitaxial growth is an oxidizing atmosphere.

6. The method according to claim 1, wherein the atmosphere in which the monocrystalline silicon layer is formed at the time of solid-phase-epitaxial growth is a reducing atmosphere.

7. The method according to claim 6, further comprising: after monocrystallizing the amorphous silicon thin film by the solid-phase-epitaxial growth or after heat treatment in the oxidizing atmosphere, performing heat treatment at a temperature higher than a solid-phase-epitaxial growth temperature in a reducing atmosphere.

8. The method according to claim 1, further comprising: before forming the amorphous silicon thin film, forming an oxide film whose thickness is less than a thickness required to function as an insulating film, on the surface of the silicon substrate in the opening.

9. The method according to claim 8, wherein the thickness of the oxide film is set at a thickness determined at an interfacial oxygen concentration ranging from $2\times10^{14}$ cm$^{-2}$ to $8\times10^{14}$ cm$^{-2}$.

10. The method according to claim 1, further comprising: performing implantation ions of silicon or germanium into the amorphous silicon thin film after performing heat treatment according to a thermal history whose temperature and time are higher and longer than the temperature and time required for the amorphous silicon thin film to crystallize, after the formation of the amorphous silicon thin film and before the solid-phase-epitaxial growth.

11. The method according to claim 1, wherein the step of forming the amorphous silicon thin film includes a step of bringing silicon or germanium into an amorphous state by ion implantation after forming a silicon thin film in a polysilicon state.

12. The method according to claim 1, further comprising: before making an opening in the insulating film, forming on the insulating film an amorphous silicon film containing at least one of oxygen, nitrogen, and carbon at a concentration of $1 \times 10^{19}$ cm$^{-3}$ or more and making the opening in the amorphous silicon film and the insulating film.

13. The method according to claim 1, wherein the memory cell array includes a NAND cell unit which has a plurality of nonvolatile memory cells connected in series and select transistors connected to both sides of the NAND cell unit, the memory cells being formed in a monocrystalline silicon layer on the insulating film and the select transistors being formed in a monocrystalline silicon layer above the opening.

14. The method according to claim 1, further comprising: after forming the monocrystalline silicon layer, processing the monocrystalline silicon layer into a striped shape and then heat-treating the processed layer in the oxidizing atmosphere.

* * * * *